(12) United States Patent
Ishida et al.

(10) Patent No.: US 10,081,172 B2
(45) Date of Patent: Sep. 25, 2018

(54) METHOD OF PREPARING LAMINATE, AND METHOD OF SEPARATING SUPPORT

(71) Applicant: Tokyo Ohka Kogyo Co., Ltd., Kawasaki-shi (JP)

(72) Inventors: Shingo Ishida, Kawasaki (JP); Takahiro Yoshioka, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 303 days.

(21) Appl. No.: 15/137,899

(22) Filed: Apr. 25, 2016

(65) Prior Publication Data
US 2016/0343601 A1   Nov. 24, 2016

(30) Foreign Application Priority Data
May 21, 2015 (JP) ................................. 2015-103993

(51) Int. Cl.
*H01L 21/683* (2006.01)
*B32B 38/10* (2006.01)

(52) U.S. Cl.
CPC .......... *B32B 38/10* (2013.01); *H01L 21/6835* (2013.01); *B32B 2310/0806* (2013.01); *H01L 2221/68318* (2013.01); *H01L 2221/68327* (2013.01); *H01L 2221/68381* (2013.01); *Y10T 156/1158* (2015.01); *Y10T 156/1168* (2015.01)

(58) Field of Classification Search
CPC ....... H01L 21/6835; H01L 2221/68318; H01L 2221/38327; H01L 2221/38381; H01L 2221/38304; Y10T 156/1158; Y10T 156/1168
See application file for complete search history.

(56) References Cited

U.S. PATENT DOCUMENTS

| | | | | |
|---|---|---|---|---|
| 2005/0233547 | A1* | 10/2005 | Noda | B32B 43/006 438/459 |
| 2011/0308739 | A1* | 12/2011 | McCutcheon | H01L 21/187 156/766 |
| 2012/0118511 | A1* | 5/2012 | Imai | B32B 38/10 156/712 |
| 2014/0057450 | A1* | 2/2014 | Bourbina | H01L 21/6835 438/759 |
| 2014/0130969 | A1* | 5/2014 | McCutcheon | B32B 7/06 156/247 |
| 2014/0147989 | A1* | 5/2014 | Luo | C09J 11/04 438/459 |

FOREIGN PATENT DOCUMENTS

| | | |
|---|---|---|
| JP | 11-116046 | 4/1999 |
| JP | 2006-32506 | 2/2006 |

* cited by examiner

*Primary Examiner* — Carson Gross
(74) *Attorney, Agent, or Firm* — Knobbe Martens Olson & Bear LLP

(57) ABSTRACT

A method of preparing a laminate, in which the laminate has a substrate and a support plate, and is provided with a release layer capable of being altered by irradiation with infrared ray, the method including forming the release layer on only a periphery of one of the substrate and the support plate; and laminating the substrate and the support plate through the release layer and a first adhesive layer.

16 Claims, 2 Drawing Sheets

METHOD OF PREPARING LAMINATE, AND METHOD OF SEPARATING SUPPORT

CROSS-REFERENCE TO RELATED APPLICATIONS

Priority is claimed on Japanese Patent Application No. 2015-103993, filed May 21, 2015, the content of which is incorporated herein by reference.

BACKGROUND OF THE INVENTION

Field of the Invention

The present invention relates to a method of preparing a laminate and a method of separating a support.

Background Art

In recent years, thinner, smaller, or lighter electronic appliances, such as IC cards, mobile phones, and the like, have been required. In order to meet these requirements, thin semiconductor chips should be used as semiconductor chips to be embedded. Therefore, it is known that the thickness (film thickness) of a wafer substrate, which is a base of a semiconductor chip, is currently 125 µm to 150 µm, but should be 25 µm to 50 µm for next-generation chips. Accordingly, in order to obtain a wafer substrate having the above film thickness, a process of thinning the wafer substrate is necessarily required.

Since the strength of a wafer substrate is lowered by thinning, in order to prevent the damage of the thinned wafer substrate, during a preparing process, a structure such as a circuit is mounted on the wafer substrate while being automatically carried in a state where a support plate is bonded to the wafer substrate. Further, after the preparing process, the wafer substrate and the support plate are separated from each other. Therefore, hitherto, various methods of peeling a support from a wafer have been used.

Japanese Unexamined Patent Application, Publication No. H11-116046 (published Apr. 27, 1999) discloses a robot hand configured to have a gripping unit for gripping the outer periphery of a wafer in a wafer carrying robot connected to an arm member rotatably disposed on a machine frame and gripping and carrying the wafer.

Further, Japanese Unexamined Patent Application, Publication No. 2006-32506 (published Feb. 2, 2006) discloses a method of peeling a semiconductor wafer, in which the semiconductor wafer is bonded to a support having rigidity through an adhesive material, the method including an insertion process of inserting an insertion member into the adhesive material, and a vibration process of applying a vibration to the adhesive material while biasing the semiconductor wafer in a direction of peeling the semiconductor wafer from the support.

SUMMARY OF THE INVENTION

Japanese Unexamined Patent Application, Publication No. H11-116046 does not disclose a method of preparing a laminate, which can prevent a substrate from being damaged at the time of separating the substrate and a support, and a method of separating a support from a laminate.

Further, in a support separating method disclosed in Japanese Unexamined Patent Application, Publication No. 2006-32506, a substrate and a support are separated by inserting a blade into an adhesive layer. Moreover, in a laminate disclosed in Japanese Unexamined Patent Application, Publication No. 2006-32506, a device for successfully separating a substrate and a support is not provided. Therefore, there is a problem that the substrate is damaged when the blade is in contact with the substrate of the laminate.

The present invention has been made in view of the above-mentioned problems, and an object thereof is to provide a method of preparing a laminate, which can prevent a substrate from being damaged at the time of separating the substrate and a support, and related technologies thereof.

The present inventors have made intensive studies in order to solve the above problems. As a result, they found a method of preparing a laminate, in which a substrate and a support can be successfully separated. Based on this finding, the present invention has been completed.

According to an aspect of the present invention, there is provided a method of preparing a laminate, in which the laminate has a substrate and a support supporting the substrate, a release layer capable of being altered by irradiation with infrared ray is provided on one surface of the surface of the substrate and the surface of the support which face each other, and the substrate and the support are laminated through a first adhesive layer containing a release agent, the method comprising:

forming the release layer on only a periphery of one of the substrate and the support; and laminating the substrate and the support through the release layer and the first adhesive layer.

According to the present invention, a method of preparing a laminate, which can prevent a substrate from being damaged at the time of separating the substrate and a support, and technologies related thereto, can be provided.

DETAILED DESCRIPTION OF THE INVENTION

Method of Preparing Laminate According to First Embodiment

A method of preparing a laminate 10 according to an embodiment (first embodiment) of the present invention will be described in detail with reference to (a) to (e) of FIG. 1.

Figure 1:
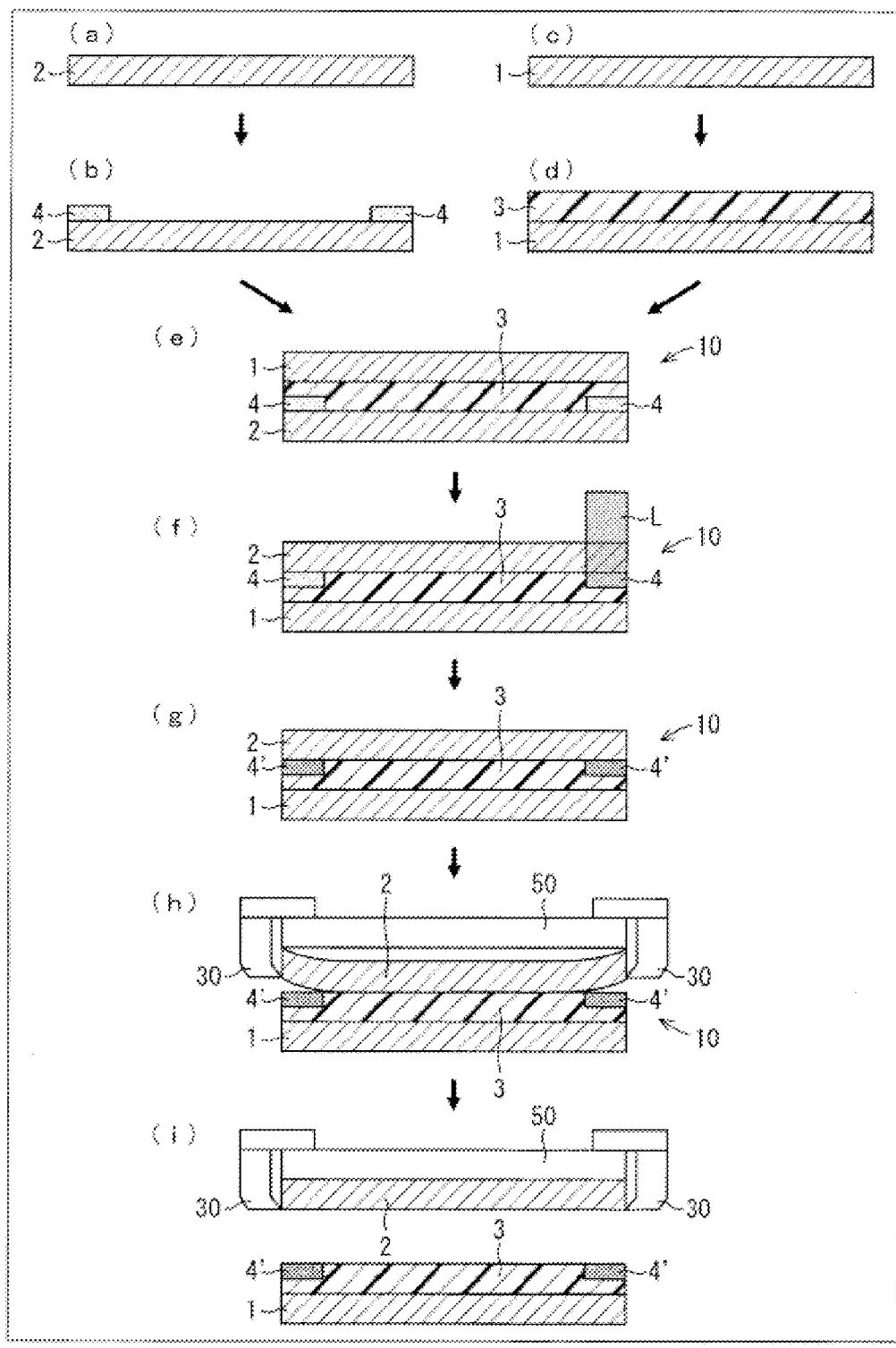
FIG. 1 is a schematic view illustrating a method of preparing a laminate and a method of separating a support according to a first embodiment of the present invention.

As shown in (a) and (b) of FIG. 1, the method of preparing a laminate 10 according to the present embodiment includes a release layer-forming process of forming a release layer 4 on only a periphery of the surface of a support plate (support) 2, the surface facing a substrate 1.

According to the above configuration, it is possible to reduce the usage of a release layer-forming composition, compared to the case of applying the release layer-forming composition on the entire surface of the flat portion of one side of the support plate 2. Therefore, it is possible to reduce the cost for forming a release layer.

The method of preparing a laminate 10 according to the present embodiment includes an adhesive layer-forming process of forming a first adhesive layer 3 containing a release agent on the substrate 1 (refer to (c) and (d) of FIG. 1), and a laminating process of laminating the substrate 1 and the support plate 2 through the first adhesive layer 3 and the release layer 4 (refer to (e) of FIG. 1).

According to the above configuration, it is possible to appropriately prepare a laminate 10 that can prevent the substrate 1 from being damaged at the time of separating the substrate 1 and the support plate 2 by altering the release layer 4 formed on only the periphery of the support plate 2.

Release Layer-Forming Process

As shown in (a) and (b) of FIG. 1, in the release layer-forming process, the release layer 4 is formed on only the periphery in the flat portion of one side of the support plate 2, and preferably only on the entire periphery.

In the method of preparing a laminate 10 according to the present embodiment, a release layer-forming composition, which is a solution in which reactive polysilsesquioxane is dissolved in a solvent, is applied onto the periphery of the support plate 2 shown in (a) of FIG. 1. Then, the reactive polysilsesquioxane is polymerized on the periphery of the support plate 2 by heating the support plate 2 coated with the release layer-forming composition. Thus, as shown in (b) of FIG. 1, a release layer 4 is formed on the periphery of the support plate 2.

Support Plate 2

The support plate 2 is used for supporting the substrate 1 in order to prevent the damage or deformation of the substrate at the time of processes, such as thinning, transporting and mounting of the substrate. The support plate 2 shown in (a) of FIG. 1 is a flat support having a circular shape in a plan view. Further, in the method of preparing a laminate according to the present embodiment, the support plate 2 can transmit infrared ray to alter the release layer. As the support plate 2 capable of transmitting infrared ray, a support made of silicon is exemplified.

The substrate 1 can be appropriately supported by using the support plate 2 made of silicon. Further, the support plate 2 made of silicon can appropriately transmit the light having a wavelength at which the release layer 4 obtained by polymerizing the reactive polysilsesquioxane can be altered.

Application of Release Layer-Forming Composition

In the release layer-forming process, a release layer-forming composition containing reactive polysilsesquioxane is applied onto only the periphery in the flat portion of one side of the support plate 2 by a spin coating method. More specifically, the release layer-forming composition is applied toward the periphery of the support plate 2 having a circular shape in a plan view using an edge bead removal (EBR) nozzle while fixing the support plate 2 to a mounting stage such as a spin chuck and rotating the support plate. Thus, the release layer 4 can be successfully formed on only the periphery of the support plate 2. In addition, the release layer-forming composition may be applied onto the periphery of the support plate 2 by an ink jet method.

Reaction by Heating

In the release layer-forming process, the reactive polysilsesquioxane contained in the release layer-forming composition is polymerized on the support plate 2 by heating the support plate 2 coated with the release layer-forming composition on the periphery thereof. In the release layer-forming process, the temperature for heating the reactive polysilsesquioxane applied on the support plate 2 is preferably 100° C. to 500° C., and more preferably 200° C. to 400° C. When the reactive polysilsesquioxane is heated at a temperature of 100° C. to 500° C., the reactive polysilsesquioxane can be appropriately polymerized, and the chemical resistance and heat resistance of the release layer 4 can be improved. In this way, the case that the release layer 4 having improved heat resistance and chemical resistance can be successfully formed on only the periphery of the support plate 2 is one of advantages of the release layer-forming process included in the method of preparing a laminate 10 according to the present embodiment.

The time taken to heat the reactive polysilsesquioxane is preferably 5 minutes to 120 minutes, and more preferably 30 minutes to 120 minutes. if the time taken to heat the reactive polysilsesquioxane is preferably 5 minutes to 120 minutes, a solvent is evaporated from the release layer 4 by heat while appropriately reacting the reactive polysilsesquioxane, so as to sufficiently remove the solvent. In addition, water, which is a by-product generated at the time of polymerizing the reactive polysilsesquioxane, can be appropriately removed. Therefore, it is possible to prevent voids from being generated between the support plate 2 and the release layer 4 by the solvent or water remaining in the release layer 4 after the formation of the laminate 10.

In the release layer-forming process, preferably, the release layer 4 is formed on the periphery having a width within a range of 0.5 mm to 10 mm from the outer end of periphery of the support plate 2 toward the inside thereof, more preferably the release layer 4 is formed on the periphery having a width within a range of 1 mm to 5 mm, and more preferably the release layer 4 is formed on the periphery having a width within a range of 2 mm to 3 mm.

The thickness (film thickness) of the release layer 4 is preferably 0.05 µm to 50 µm, more preferably 1 µm to 20 µm, and most preferably 2 µm to 10 µm. If the thickness of the release layer 4 is within the range of 0.05 µm to 50 µm, it is possible to forma release layer capable of causing the desired alteration of the release layer 4 by irradiation with infrared ray for a short period of time and irradiation with low-energy infrared ray. Further, from the viewpoint of altering a release layer by irradiating the release layer with infrared ray to make the release layer brittle in the preliminary treatment process, more preferably, the film thickness of the release layer is within the range of 0.05 µm to 50 µm. Moreover, from the viewpoint of preventing the infrared ray applied toward the release layer from passing through the release layer and the first adhesive layer to be applied to the substrate in the preliminary treatment process, more preferably, the film thickness of the release layer is within the range of 0.05 µm to 50 µm.

Release Layer 4

The release layer 4 is a layer that can be altered by irradiation with infrared ray. Due to the formation of the release layer 4, in the periphery of the support plate 2 in the laminate 10, it is possible to improve the adhesiveness between the release layer 4 and the first adhesive layer 3.

In the method of preparing a laminate 10 according to the present embodiment, the release layer 4 is formed on the periphery of the support plate 2 by polymerizing the reactive polysilsesquioxane contained in the release layer-forming composition by heating.

Release Layer-Forming Composition

The release layer-forming composition is a composition for forming the release layer 4, and contains reactive polysilsesquioxane. The release layer-forming composition may further contain a solvent, a crosslinkable group-containing siloxane, and other components, considering various treatments performed on the substrate 1 of the laminate 10.

Reactive Polysilsesquioxane

In the present specification, the reactive polysilsesquioxane is polysilsesquioxane having a silanol group or a functional group capable of forming the silanaol group by hydrolysis at the end of a polysilsesquioxane skeleton, and the silianol group and the functional group capable of forming the silanaol group can be polymerized with each other by condensing the silanol group or the functional group. If the reactive polysilsesquioxane is provided with the silianol group and the functional group capable of forming the silanaol group, it is possible to adopt a reactive polysilsesquioxane having a silsesquioxane skeleton of a random structure, a cage structure, or a ladder structure.

It is preferable that the reactive polysilsesquioxane has a structure represented by Formula (1) below.

[Chemical formula 1]

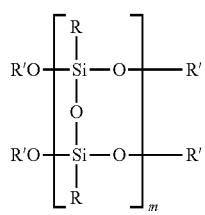
(1)

In Formula (1), R's are each independently selected from the group consisting of a hydrogen atom and an alkyl group having 1 to 10 carbon atoms, and, more preferably, selected from the group consisting of a hydrogen atom and an alkyl group having 1 to 5 carbon atoms. If each of R's is a hydrogen atom and an alkyl group having 1 to 10 carbon atoms, the reactive polysilsesquioxane represented by Formula (1) can be appropriately condensed by heating in the release layer-forming process.

In Formula (1), m is preferably an integer of 1 to 100, and more preferably an integer of 1 to 50. Since the reactive polysilsesquioxane is provided with a repeating unit represented by Formula (1), the content of Si—O bonds is high compared to that of Si—O bonds formed by using other materials, and thus it is possible to form a release layer having high absorbance at infrared wavelengths (0.78 μm to 1,000 μm), preferably far-infrared wavelengths (3 μm to 1,000 μm), more preferably wavelength of 9 μm to 11 μm.

In Formula (1), Rs each independently are organic groups and are the same as or different from each other. Examples of R may include an aryl group, an alkyl group, and an alkenyl group, and each of these organic groups may have a substituent group.

In the case where R is an aryl group, a phenyl group, a naphthyl group, an anthryl group, and a phenanthryl group can be exemplified, and a phenyl group is more preferable. The aryl group may be bonded to a polysilsesquioxane skeleton through an alkylene group having 1 to 5 carbon atoms.

In the case where R is an alkyl group, the alkyl group can be a linear, branched, or cyclic alkyl group. Further, in the case where R is an alkyl group, the alkyl group is preferably an alkyl group having 1 to 15 carbon atoms, and more preferably an alkyl group having 1 to 6 carbon atoms. Moreover, in the case where R is a cyclic alkyl group, the cyclic alkyl group may be an alkyl group having a monocyclic structure or dicyclic to tetracyclic structures.

In the case where R is an alkenyl group, the alkenyl group, similarly to the alkyl group, can be a linear, branched, or cyclic alkenyl group. The alkenyl group is preferably an alkenyl group having 2 to 15 carbon atoms, and more preferably an alkenyl group having 2 to 6 carbon atoms. Further, in the case where R is a cyclic alkenyl group, the cyclic alkenyl group may be an alkenyl group having a monocyclic structure or dicyclic to tetracyclic structures. Examples of the alkenyl group can include a vinyl group and an allyl group.

As the substituent group included in R, a hydroxyl group and an alkoxy group can be exemplified. In the case where the substituent group is an alkoxy group, the alkoxy group can be a linear, branched, or cyclic alkylalkoxy group, and the number of carbon atoms in the alkoxy group is preferably 1 to 15, and more preferably 1 to 10.

In one aspect, the content of siloxane in the reactive polysilsesquioxane is preferably 70 mol % to 99 mol %, and more preferably 80 mol % to 99 mol %. If the content of siloxane in the reactive polysilsesquioxane is preferably 70 mol % to 99 mol %, it is possible to form a release layer that can be preferably altered by irradiation with infrared light (preferably far-infrared light, more preferably light having a wavelength of 9 μm to 11 μm).

Further, in one aspect, the weight average molecular weight (Mw) of the reactive polysilsesquioxane is preferably 500 to 50,000, and more preferably 1,000 to 10,000. If the weight average molecular weight (Mw) of the reactive polysilsesquioxane is preferably 1,000 to 10,000, the reactive polysilsesquioxane can be appropriately dissolved in a solvent, and can be appropriately applied onto the support.

Examples of commercially available products that can be used as the reactive polysilsesquioxane may include SR-13, SR-21, SR-23, and SR-33, manufactured by KONISHI CHEMICAL IND CO., LTD.

Crosslinkable Group-Containing Siloxane

It is more preferred that the release layer-forming composition contains the crosslinkable group-containing siloxane.

In the present specification, the crosslinkable group-containing siloxane is a compound having a crosslinkable group at the side chain of a siloxane skeleton, as represented by General Formula (2) below. Examples of the crosslinkable group include an epoxy group, an alkoxy group, a carboxyl group, a carbonyl group, and a hydroxyl group. Among these, an epoxy group is preferable. The reactive polysilsesquioxane and the crosslinkable group-containing siloxane are described as preferable ones. In the point that the structure represented by General Formula (1) above and the structure represented by General Formula (2) below are clearly different from each other, and, particularly, in the point that the reactive polysilsesquioxane has a ladder-type structure, both the reactive polysilsesquioxane and the crosslinkable group-containing siloxane are materials different from each other. Further, in the point that the kinds of side chains bonded to main chains composed of Si—O bonds in both of them are different from each other, that is, in the point that the side chain of the crosslinkable group-containing siloxane includes a crosslinkable group, and preferably an epoxy group, both the reactive polysilsesquioxane and the crosslinkable group-containing siloxane are materials different from each other.

(2)

(Here, $R^1$ is a crosslinkable group, and $R^2$ is selected from an alkyl group, an aryl group and an aromatic group. Each of m and n represents a mol percentage of subscript-attached structural units to all structural units in the polysiloxane, and n+m=100% and n>0).

In the crosslinkable group-containing siloxane of the present invention, crosslinkable groups are crosslinked and polymerized with each other by heating, so as to form a polymer. At that time, if the solution containing the crosslinkable group-containing siloxane of the present invention further contains a thermal acid generator, the crosslinking polymerization of the above-described cationically polymerizable crosslinkable groups appropriately occurs.

In the process of forming the release layer 4, the crosslinkable group-containing siloxane of the present invention is used in combination with the reactive polysilsesquioxane.

Since the crosslinkable group-containing siloxane of the present invention, similarly to the reactive polysilsesquioxane, has Si—O bonds in a siloxane skeleton, the release layer 4 composed of a polymer of the reactive polysilsesquioxane and the crosslinkable group-containing siloxane can exhibit laser reactivity and laser absorptivity equivalent to those of the release layer composed of a polymer of the reactive polysilsesquioxane.

Further, the crosslinkable group existing at the side chain of the crosslinkable group-containing siloxane is configured such that crosslinking polymerization occurs between molecules, and thus it is possible to improve the chemical resistance of the release layer 4 itself containing the polymer of the crosslinkable group.

From the viewpoint of sufficiently improving the chemical resistance of the release layer 4 itself, the amount of the crosslinkable group-containing siloxane used in the release layer 4 is preferably 10% by weight to 90% by weight, and more preferably 20% by weight to 60% by weight with respect to the total weight of the reactive polysilsesquioxane and the crosslinkable group-containing siloxane.

In terms of preparing a laminate including the release layer 4 excellent in physical properties such as laser reactivity and heat resistance, the crosslinkable group-containing siloxane is preferably epoxy siloxane represented by General Formula (2-1) below.

[Chemical formula 2]

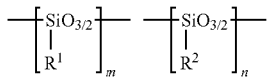

(2-1)

In General Formula (2-1), $R^1$ is a group containing an epoxy group or an oxetanyl group, $R^2$ is an alkyl group or an aryl group, each of subscripts m and n represents a mol percentage of the subscript-attached structural units to all structural units in the polysiloxane, m is 50 mol % to 90 mol %, and n is 10 mol % to 50 mol %, provided that the sum of m and n is 100 mol %.

Examples of the epoxy siloxane include polymer E and polymer F represented by the following Formulae, respectively, and trade names X-22-2046 and KF-102 manufactured by Shin-Etsu Silicone CO., Ltd.

Polymer E: a polymer represented by Formula (2-2) below (weight average molecular weight: 1,000 to 20,000)

[Chemical formula 3]

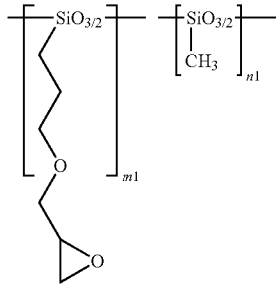

(2-2)

In Formula (2-2), each of subscripts m1 and n1 represents a mol percentage of the subscript-attached structural units to all structural units in the polymer E, m1 is 50 mol % to 90 mol %, and n1 is 10 mol % to 50 mol %, provided that the sum of m1 and n1 is 100 mol %.

Polymer F: a polymer represented by Formula (2-3) below (weight average molecular weight: 1,000 to 20,000)

[Chemical formula 4]

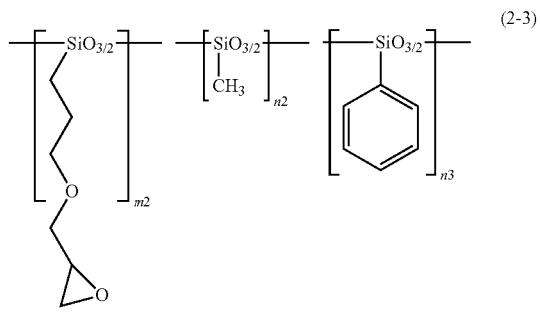

(2-3)

In Formula (2-3), each of subscripts m2, n2, and n3 represents a mol percentage of the subscript-attached structural units to all structural units in the polymer F, m2 is 50 mol % to 90 mol %, n2 is 1 mol % to 10 mol %, and n3 is 5 mol % to 50 mol %, provided that the sum of m2, n2, and n3 is 100 mol %.

Solvent

The solvent for preparing the release layer-forming composition may be a solvent capable of dissolving the reactive polysilsesquioxane and the crosslinkable group-containing siloxane. A solvent shown below can be used.

Examples of the solvent may include: linear hydrocarbons, such as hexane, heptane, octane, nonane, methyl octane, decane, undecane, dodecane, and tridecane; branched hydrocarbons having 4 to 15 carbon atoms; cyclic hydrocarbons, such as cyclohexane, cycloheptane, cyclooctane, naphthalene, decahydronaphthalene, and tetrahydronaphthalene; terpene-based solvents, such as p-menthane, o-menthane, m-menthane, diphenyl menthane, 1,4-terpene, 1,8-terpene, bornane, norbornane, pinane, thujane, carane, longifolene, geraniol, nerol, linalol, citral, citronellol, menthol, isomenthol, neo-menthol, α-terpineol, β-terpineol, γ-terpineol, terpinene-1-ol, terpinene-4-ol, dihydroterpinyl acetate, 1,4-cineol, 1,8-cineol, borneol, carvone, ionone, thujone, camphor, d-limonene, 1-limonene, and dipentene; latones, such as γ-butyrolactone; ketones, such as acetone, methyl ethyl ketone, cyclohexanone (CH), methyl-n-pentyl ketone, methyl isopentyl ketone, and 2-heptanone; polyhydric alcohols, such as ethylene glycol, diethylene glycol, propylene glycol, and dipropylene glycol; derivatives of polyhydric alcohols, such as compounds having an ester bond (for example, ethylene glycol monoacetate, diethylene glycol monoacetate, propylene glycol monoacetate, and dipropylene glycol monoacetate), and compounds having an ether bond (for example, monoalkyl ethers (such as monomethyl ether, monoethyl ether, monopropyl ether, and monobutyl ether) or monophenyl ethers of the polyhydric alcohols and the compounds having an ester bond); cyclic ethers, such as dioxane; esters, such as methyl lactate, ethyl lactate (EL), methyl acetate, ethyl acetate, butyl acetate, methoxybutyl acetate, methyl pyruvate, ethyl pyruvate, methyl methoxypropionate, and ethyl ethoxypropionate; and aromatic organic solvents, such as anisole, ethylbenzyl ether, cresylmethyl ether, diphenyl ether, dibenzyl ether, phenetole, and butyl phenyl ether.

As the solvent, derivatives of polyhydric alcohols are preferable. Examples of derivatives of polyhydric alcohols include propylene glycol monomethyl ether acetate (PGMEA) and propylene glycol monomethyl ether (PGME). PGMEA or PGME is preferable, and PGMEA is more preferable.

Other Components in Release Layer-Forming Composition

The release layer-forming composition may contain a thermal acid generator as another component. The thermal acid generator is a compound generating acid ($H^+$) by heating. Thus, the release layer-forming composition is applied onto the support plate 2, and then heated to generate the acid ($H^+$), thereby accelerating the reaction of reactive polysilsesquioxane by the generated acid ($H^+$). Further, in the crosslinkable group-containing siloxane, for example, the polymerization reaction of a crosslinkable group such as an epoxy group can be initiated. Therefore, when the release layer-forming composition contains the thermal acid generator, it is possible to appropriately react the reactive polysilsesquioxane and the crosslinkable group-containing siloxane in the release layer-forming process, and it is possible to more appropriately form a release layer, so as to improve the chemical resistance of the release layer.

The thermal acid generator may be any compound that generates an acid ($H^+$) by heating, and examples thereof include K-PURE CXC-1821 (manufactured by KING INDUSTRY CO., Ltd.). The polymerization of the crosslinkable group-containing siloxane can be appropriately initiated by the generated acid ($H^+$).

The thermal acid generator may be appropriately selected from commonly known ones, and examples thereof may include cationic or protonic acid catalysts, such as trifluoromethane sulfonate, a boron trifluoride ether complex compound, hexafluoride phosphate, perfluorobutane sulfonic acid, and boron trifluoride. Among these, hexafluoride phosphate, trifluoromethane sulfonic acid, and perfluorobutane sulfonic acid are preferable, and trifluoromethane sulfonic acid is more preferable.

Specific examples thereof include trifluoromethanesulfonic acid diethyl ammonium, trifluoromethane sulfonic acid triethylammonium, trifluoromethanesulfonic acid diisopropyl ammonium, and trifluoromethane sulfonic acid ethyl diisopropyl ammonium. Among aromatic onium salts also used as an acid generator, there are aromatic onium salts that generate cationic species by heat, and these aromatic onium salts can also be used as a thermal cationic polymerization initiator. Examples thereof include SANAID SI-45, SI-47, SI-60, SI-60L, SI-80, SI-80L, SI-100, SI-100L, SI-110L, SI-145, SI-150, SI-160, SI-180L, SI-B3, and SI-B3A (all, manufactured by SANSHIN CHEMICAL INDUSTRY CO., LTD.). In addition, examples thereof include CI-2921, CI-2920, CI-2946, CI-3128, CI-2624, CI-2639, and CI-2064 (all, manufactured by NIPPON SODA CO., LTD.); CP-66 and CP-77 (all, manufactured by ADEKA CORPORATION); FC-520 (manufactured by 3M COMPANY); and K-PURE TAG-2396, TAG-2713S, TAG-2713, TAG-2172, TAG-2179, TAG-2168E, CTAG-2722, TAG-2507, TAG-2678, TAG-2681, TAG-2679, TAG-2690, TAG-2700, TAG-2710, TAG-2100, CDX-3027, CXC-1615, CXC-1616, CXC-1750, CXC-1738, CXC-1614, CXC-1742, CXC-1743, CXC-1613, CXC-1739, CXC-1751, CXC-1766, CXC-1763, CXC-1736, CXC-1756, CXC-1821, and CXC-1802-60 (all, manufactured by KING INDUSTRY CO., LTD.).

Among the above-described thermal acid generators, trifluoromethane sulfonate or hexafluoride phosphate is preferable, and trifluoromethane sulfonate is more preferable.

First Adhesive Layer-Forming Process

In the first adhesive layer-forming process, an adhesive containing a release agent and a thermoplastic resin is applied onto a substrate 1 shown in (c) of FIG. 1, so as to form a first adhesive layer 3 (refer to (d) of FIG. 1).

In the first adhesive layer-forming process, the first adhesive layer 3 can be formed by applying the adhesive by a method, such as spin coating, dipping, roller blade, spray coating, or slit coating. In addition, the first adhesive layer 3 may be formed by bonding a film previously coated with the adhesive on both sides thereof (so called, dry film) to the substrate 1 instead of directly applying the adhesive onto the substrate 1.

In the first adhesive layer-forming process, the thickness of the first adhesive layer 3 may be appropriately set depending on the kind of the substrate 1 and the support plate 2 to be bonded with each other or the treatment to be carried out to the substrate 1 after bonding, but is preferably within a range of 10 μm to 150 μm, and more preferably with a range of 15 μm to 100 μm.

Substrate 1

The substrate 1 may be subjected to a process of thinning, mounting, or the like while being supported by the support plate 2. In the method of preparing a laminate 10 according to the present embodiment, a silicon wafer can be used as the substrate 1. The silicon wafer may be mounted with a structure, such as an integrated circuit or a metal bump, on the surface thereof.

First Adhesive Layer 3

The first adhesive layer 3 is used to bond the substrate 1 and the support plate 2. The adhesive for forming the first adhesive layer 3 contains a release agent, a thermoplastic resin, and a solvent. If necessary, the adhesive may contain other components.

Here, since the solvent used in the adhesive for forming the first adhesive layer 3 is the same as the solvent for preparing the solution of the release layer-forming composition containing the above-described reactive polysilsesquioxane, a description thereof will be omitted.

The thermoplastic resin is a resin which is softened by heating to exhibit plasticity and which is solidified by cooling. The substrate 1 and the support plate 2 are bonded to each other by the adhesiveness of the thermoplastic resin. As the thermoplastic resin used in the adhesive for forming the first adhesive layer 3, various thermoplastic resins well known in the art, such as acryl-based resins, novolak-based resins, naphthoquinone-based resins, hydrocarbon-based resins, polyimide-based resins, and elastomer resins, can be used. More preferably, elastomer resins, hydrocarbon-based resins, acryl-styrene-based resins, polysulfone-based resins, maleimide-based resins, and combinations thereof can be more preferably used.

Elastomer

The elastomer is preferably an elastomer containing a styrene unit as a structural unit of a main chain, and the "styrene unit" may have a substituent group. Examples of the substituent group include an alkyl group having 1 to 5 carbon atoms, an alkoxy group having 1 to 5 carbon atoms, an alkoxyalkyl group having 1 to 5 carbon atoms, an acetoxy group, and a carboxyl group. The content of the styrene unit is preferably within the range of 14% by weight to 50% by weight. The weight average molecular weight of the elastomer is preferably within the range of 10,000 to 200,000.

If the content of the styrene unit is within the range of 14% by weight to 50% by weight and the weight average molecular weight of the elastomer is within the range of 10,000 to 200,000, the elastomer is easily dissolved in the following hydrocarbon-based solvent, and thus the adhesive layer can be removed more easily and rapidly. Further, if the content of the styrene unit is within the above range and the weight average molecular weight of the elastomer is within the above range, a wafer exhibits excellent resistance to a resist solvent (for example, PGMEA, PGME, etc.), acid (hydrofluoric acid, etc.), or alkali (TMAH, etc.) which is exposed when the wafer is subjected to a resist lithography process.

The elastomer may be mixed with the above-described (meth)acrylic acid ester.

The content of the styrene unit is more preferably 17% by weight or more, and is more preferably 40% by weight or less.

The weight average molecular weight of the elastomer is more preferably within the range of 20,000 or more, and is more preferably within the range of 150,000 or less.

As the elastomer, various elastomers can be used if the content of the styrene unit is within the range of 14% by weight to 50% by weight and the weight average molecular weight of the elastomer is within the range of 10,000 to 200,000. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof; and a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), styrene-ethylene-ethylene-propylene-styrene block copolymers having a reaction-crosslinked styrene block (Septon V9461 (manufactured by KURARAY CO., LTD.) and Septon V9475 (manufactured by KURARAY CO., LTD.)), a styrene-ethylene-butylene-styrene block copolymer having a reaction-crosslinked styrene block (Septon V9827 having a reactive polystyrene-based hard block (manufactured by KURARAY CO., LTD.)), and a polystyrene-poly (ethylene-ethylene/propylene) block-polystyrene block copolymer (SEEPS-OH: terminal hydroxyl group-modified). Elastomers having s styrene unit content and a weight average molecular weight within the above ranges can be used.

Among the elastomers, the hydrogenated products are preferable. In the case of the hydrogenated products, stability to heat is improved, and alteration, such as decomposition or polymerization is difficult to occur. The hydrogenated products are more preferable even from the viewpoint of solubility to a hydrocarbon-based solvent and resistance to a resist solvent.

Among these elastomers, an elastomer having styrene block polymers at both ends thereof is more preferable. The reason for this is that the elastomer exhibits higher heat resistance by block-polymerizing styrene having high thermal stability at both ends thereof.

More specifically, the elastomer is more preferably a hydrogenated product of a block copolymer of styrene and a conjugated diene. In this case, stability to heat is improved, and alteration, such as decomposition or polymerization, is difficult to occur. Further, the elastomer exhibits higher heat resistance by block-polymerizing styrene having high thermal stability at both ends thereof. Moreover, this eleastomer is more preferable from the viewpoint of solubility to a hydrocarbon-based solvent and resistance to a resist solvent.

Examples of commercially available products that can be used as the elastomer contained in the adhesive constituting the first adhesive layer 3 may include "SEPTON (trade name)" manufactured by KURARAY CO., LTD., "HYBRAR (trade name)" manufactured by KURARAY CO., LTD., "TUFTEC (trade name)" manufactured by Asahi Kasei Corporation, and "DYNARON (trade name)" manufactured by JSR Corporation.

The content of the elastomer contained in the adhesive constituting the first adhesive layer 3, for example, is preferably within the range of 50 parts by weight to 99 parts by weight, more preferably within the range of 60 parts by weight to 99 parts by weight, and most preferably within the range of 70 parts by weight to 95 parts by weight, with respect to 100 parts by weight of the total amount of the adhesive composition. If the content thereof is within the above range, it is possible to appropriately bond the wafer and the support while maintaining heat resistance.

Further, the elastomer may be a mixture of a plurality of kinds. That is, the adhesive constituting the adhesive layer 3 may contain a plurality of kinds of elastomers. At least one of the plurality of kinds of elastomers may contain a styrene unit as a structural unit of a main chain. At least one of the plurality of kinds of elastomers is included within the scope of the present invention if it has a styrene unit content within the range of 14% by weight to 50% by weight and a weight average molecular weight of 10,000 to 200,000. Further, in the case where the adhesive constituting the adhesive layer 3 contains the plurality of kinds of elastomers, as a mixed result, the content of the styrene unit may be adjusted to be within the above range. For example, if SEPTON 4033 (trade name, manufactured by KURARAY CO., LTD.) having a styrene unit content of 30% by weight and SEPTON 2063 (trade name, manufactured by KURARAY CO., LTD.) having a styrene unit content of 13% by weight are mixed at weight ratio of 1 to 1, the content of styrene to the total elastomer contained in the adhesive becomes 21% by weight to 22% by weight, and thus becomes 14% by weight or more. Further, for example, if SEPTON having a styrene unit content of 10% by weight and SEPTON having a styrene unit content of 60% by weight are mixed at weight ratio of 1 to 1, the content of styrene to the total elastomer contained in the adhesive becomes 35% by weight, and thus becomes within the above range. The present invention may be configured in such a form. Meanwhile, it is most preferable that all of the plurality of kinds of elastomers contained in the adhesive constituting the adhesive layer 3 contain a styrene unit within the above range and have a weight average molecular weight within the above range.

Hydrocarbon Resin

The hydrocarbon resin is a resin having a hydrocarbon skeleton and obtained by polymerizing a monomer composition. Examples of the hydrocarbon resin include, but are not limited to, a cycloolefin-based polymer (hereinafter, referred to as "resin (A)") and at least one resin (hereinafter, referred to as "resin (B)") selected from the group consisting of terpene resin, rosin resin, and petroleum resin.

The resin (A) may be a resin obtained by polymerizing a monomer component containing a cycloolefin-based monomer. Specifically, as the resin (A), a ring-opening (co) polymer of a monomer component containing a cycloolefin-based monomer, or a resin obtained by addition-copolymerizing a monomer component containing a cycloolefin-based monomer is exemplified.

Examples of the cycloolefin-based monomer contained in the monomer component constituting the resin (A) include bicyclic monomers, such as norbornene and norbornadiene; tricyclic monomers, such as dicyclopentadiene and hydroxy dicyclopentadiene; tetracyclic monomers, such as tetracyclododecene; pentacyclic monomers, such as cyclopentadiene trimer; heptacyclic monomers, such as tetracyclopentadiene; and alkyl (methyl, ethyl, propyl, butyl, etc.) substitution products, alkenyl (vinyl, etc.) substitution products, alkylidene (ethylidene, etc.) substitutionproducts, andaryl (phenyl, tolyl, naphthyl, etc.) substitution products of these polycyclic monomers. Among these, particularly, a norbonene-based monomer selected from the group consisting of norbonene, tracyclododecene, and alkyl substitution products thereof is preferable.

The monomer component constituting the resin (A) may contain other monomers copolymerizable with the above-described cycloolefin-based monomers, and, preferably, may contain an alkene monomer. Examples of the alkene monomer include ethylene, propylene, 1-butene, isobutene, 1-hexene, and α-olefin. The alkene monomer may be a linear alkene monomer, and may also be a branched alkene monomer.

It is preferable that the monomer component constituting the resin (A) contains a cycloolefin monomer from the viewpoint of high heat resistance (low thermal composition, thermal weight reduction). The ratio of the cycloolefin monomer to the entire monomer component constituting the resin (A) is preferably 5 mol % or more, more preferably 10 mol % or more, and further preferably 20 mol % or more. The ratio of the cycloolefin monomer to the entire monomer component constituting the resin (A) is not particularly limited, but is preferably 80 mol % or less, and more preferably 70 mol % or less, from the viewpoint of solubility and temporal stability in solution.

The monomer component constituting the resin (A) may contain a linear or branched alkene monomer. The ratio of the alkene monomer to the entire monomer component constituting the resin (A) is not particularly limited, but is preferably 10 mol % to 90 mol %, more preferably 20 mol % to 85 mol %, and further preferably 30 mol % to 80 mol %, from the viewpoint of solubility and flexibility.

It is preferable in terms of preventing the generation of gas at high temperature that the resin (A), similarly to a resin obtained by polymerizing a monomer component containing a cycloolefin monomer and an alkene monomer, is a resin having no polar group.

The polymerization method or polymerization condition at the time of polymerizing the monomer component is not particularly limited, and may be appropriately set according to a general method.

Examples of commercially available products that can be used as the resin (A) include "TOPAS" manufactured by Polyplastics Co., Ltd., "APEL" manufactured by Mitsui Chemicals, Inc., "ZEONOR" and "ZEONEX" manufactured by ZEON CORPORATION, and "ARTON" manufactured by JSR Corporation.

The glass transition temperature (Tg) of the resin (A) is preferably 60° C. or higher, and particularly preferably 70° C. or higher. If the glass transition temperature (Tg) of the resin (A) is 60° C. or higher, the softening of the adhesive layer 3 can be further prevented when the laminate is exposed to a high-temperature environment.

The resin (B) is at least one resin selected from the group consisting of terpene-based resin, rosin-based resin, and petroleum resin. Specifically, examples of the terpene-based resin include terpene resin, terpene phenol resin, modified terpene resin, hydrogenated terpene resin, and hydrogenated terpene phenol resin. Examples of the rosin-based resin include rosin, rosin ester, hydrogenated rosin, hydrogenated rosin ester, polymerized rosin, polymerized rosin ester, and modified rosin. Examples of the petroleum resin include aliphatic or aromatic petroleum resin, hydrogenated petroleum resin, modified petroleum resin, alicyclic petroleum resin, and coumarone-indene petroleum resin. Among these, hydrogenated terpene resin and hydrogenated petroleum resin are more preferable.

The softening point of the resin (B) is not particularly limited, but is preferably 80° C. to 160° C. If the softening point of the resin (B) is 80° C. to 160° C., the softening of the laminate can be further prevented when the laminate is exposed to a high-temperature environment, and adhesion failure does not occur.

The weight average molecular weight (Mw) of the resin (B) is not particularly limited, but is preferably 300 to 3,000. If the weight average molecular weight of the resin (B) is 300 or more, heat resistance becomes sufficient, and the degassing amount in a high-temperature environment decreases. Further, if the weight average molecular weight of the resin (B) is 3,000 or less, the dissolution rate of the adhesive layer to the hydrocarbon solvent is improved. Therefore, the residues of the adhesive layer on the substrate after separating the support can be rapidly dissolved and removed. In the present embodiment, the weight average molecular weight of the resin (B) means a polystyrene-converted molecular weight measured by gel permeation chromatography (GPC).

As the resin, a mixture of the resin (A) and the resin (B) may be used. Heat resistance is improved by mixing the resin (A) and the resin (B). For example, the mixing ratio of the resin (A) and the resin (B) satisfies (A):(B)=80:20 to 55:45 (mass ratio), but is excellent in heat resistance and flexibility at the time of high-temperature environment, which is thus preferable.

For example, a cycloolefin copolymer, which is a copolymer of a repeating unit represented by the following Chemical Formula (3) and a repeating unit represented by the following Chemical Formula (4), can be used as a resin of an adhesive component.

[Chemical formula 5]

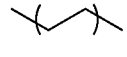

(3)

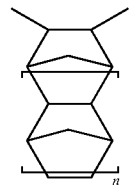

(4)

In Chemical Formula (4), n is 0 or an integer of 1 to 3.

As such a cycloolefin copolymer, APL 8008T, APL 8009T, and APL 6013T (all, manufactured by Mitsui Chemicals, Inc.) can be used.

Acryl-Styrene-Based Resin

As the acryl-styrene-based resin, there is exemplified a resin obtained by polymerizing styrene or a styrene derivative with a (meth)acrylic acid ester using these components as monomers.

Examples of the (meth)acrylic acid ester include a (meth) acrylic acid alkyl ester having a chain structure, a (meth) acrylic acid ester having an aliphatic ring, and a (meth) acrylic acid ester having an aromatic ring. Examples of the (meth)acrylic acid alkyl ester having a chain structure include an acryl-based long-chain alkyl ester having an alkyl group having 15 to 20 carbon atoms and an acryl-based alkyl ester having an alkyl group having 1 to 14 carbon atoms. As the acryl-based long-chain alkyl ester, there is exemplified an alkyl ester of acrylic acid or methacrylic acid in which the alkyl group is a n-pentadecyl group, a n-hexadecyl group, a n-heptadecyl group, a n-octadecyl group, a n-nonadecyl group, or a n-eicosyl group. Here, this alkyl group may be a branched alkyl group.

As the acryl-based alkyl ester having an alkyl group having 1 to 14 carbon atoms, there is exemplified a commonly known acryl-based alkyl ester that is used in an existing acryl-based adhesive. For example, there is exemplified an alkyl ester of acrylic acid or methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, or a tridecyl group.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate. Among these, isobornyl methacrylate and dicyclopentanyl (meth)acrylate are more preferable.

The (meth)acrylic acid ester having an aromatic ring is not particularly limited, but examples of the aromatic ring include a phenyl group, a benzyl group, a tolyl group, a xylyl group, a biphenyl group, a naphthyl group, an anthracenyl group, a phenoxymethyl group, and a phenoxyethyl group. The aromatic ring may have a linear or branched alkyl group having 1 to 5 carbon atoms. Specifically, phenoxyethyl acrylate is more preferable.

Polysulfone-Based Resin

It is preferable that the adhesive for forming the first adhesive layer 3 contains a polysulfone-based resin. In the case where the first adhesive layer 3 is formed by the polysulfone-based resin, even though the laminate 10 is treated at high temperature, the first adhesive layer 3 can be dissolved in a subsequent process, and thus a laminate 10 capable of peeling the support plate from the substrate can be prepared.

The polysulfone-based resin has a structure composed of at least one structural unit of a polysulfone structural unit represented by General Formula (5) below and a polyether sulfone structural unit represented by General Formula (6) below.

[Chemical formula 6]

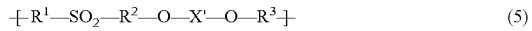
(5)

(6)

$R^1$, $R^2$, and $R^3$ of the General Formula (5) and $R^1$ and $R^2$ of the General Formula (6) are each independently selected from the group consisting of a phenylene group, a naphthylene group, and an anthrylene group, and X' is an alkylene group having 1 to 3 carbon atoms.

Since the polysulfone-based resin has at least one of a polysulfone structural unit represented by the Formula (5) and a polyether sulfone structural unit represented by Formula (6), even though the substrate 1 is treated under a high-temperature condition after bonding the substrate 1 and the support plate 2, it is possible to form a laminate 10 capable of preventing the adhesive layer 3 from being insolubilized by decomposition and polymerization. The polysulfone-based resin, as long as it is a polysulfone resin composed of polysulfone structural units represented by the Formula (5), is stable even when being heated to higher temperature. Therefore, it is possible to prevent the residues caused by the adhesive layer from being generated on the substrate after cleaning.

The weight average molecular weight of the polysulfone-based resin is preferably within a range of 30,000 to 70,000, and more preferably within a range of 30,000 to 50,000. If the weight average molecular weight of the polysulfone-based resin is within the range of 30,000 or more, it is possible to obtain an adhesive composition that can be used at a high temperature of 300° C. or higher. Further, if the average molecular weight (Mw) of the polysulfone-based resin is within the range of 70,000 or less, the polysulfone-based resin can be appropriately dissolved by a solvent. That is, it is possible to obtain an adhesive composition that can be appropriately removed by a solvent.

Maleimide-Based Resin

Examples of the maleimide-based resin include resins obtained by polymerizing: maleimides having an alkyl group, such as N-methyl maleimide, N-ethyl maleimide, N-n-propyl maleimide, N-isopropyl maleimide, N-n-butyl maleimide, N-iso-butyl maleimide, N-sec-butyl maleimide, N-tert-butyl maleimide, N-n-pentyl maleimide, N-n-hexyl maleimide, N-n-heptylmaleimide, N-n-octylmaleimide, n-laurylmaleimide, and N-stearyl maleimide; maleimides having an aliphatic hydrocarbon group, such as N-cyclopropyl maleimide, N-cyclobutyl maleimide, N-cyclopentyl maleimide, N-cyclohexyl maleimide, N-cycloheptyl maleimide, and N-cyclooctyl maleimide; and aromatic maleimides having an aryl group, such as N-phenyl maleimide, N-m-methyl phenyl maleimide, N-o-methyl phenyl maleimide, and N-p-methyl phenyl maleimide, as monomers.

It is preferable that the adhesive layer 3 is formed using a resin other than photocurable resins (for example, UV-curable resins). If a resin other than photocurable resins is used, it is possible to prevent residues from remaining in the vicinity of minute unevenness of the supported substrate after peeling or removing the adhesive layer 3. In particular, as the adhesive constituting the adhesive layer 3, an adhesive soluble in a specific solvent, not soluble in any solvent, is preferable. The reason for this is that the adhesive layer 3 can be removed by dissolving the adhesive layer 3 in a solvent without applying physical force to the substrate 1. In this case, the adhesive layer 3 can be easily removed even from the substrate 1, the strength of which is lowered upon the removal of the adhesive layer 3, without damaging or deforming the substrate 1.

Release Agent

The first adhesive layer 3 contains a release agent. Since the first adhesive layer 3 contains a release agent, it is possible to adjust the adhesiveness of the first adhesive layer 3 to the substrate 1 and the support plate 2. Thus, after performing a desired treatment on the substrate 1, it is possible to form a laminate 10 capable of successfully separating the support plate 2 from the substrate 1.

As the release agent, silicone can be exemplified. More specifically, as the silicone, silicone oil is exemplified.

Specific examples of the silicone oil may include straight silicone oil, modified silicone oil, and a cured product of the modified silicone oil.

Straight Silicone Oil

Examples of straight silicone oil include dimethyl silicone oil, methyl phenyl silicone oil, and methyl hydrogen silicone oil. Examples of the commercially available products of these straight silicon oils include commercially available products manufactured by Shin-Etsu Chemical Co., Ltd. Examples of these commercially available products include dimethyl silicone oils, such as KF96-10, KF96-100, KF96-1000, KF96H-10000, KF96H-12500, and KF96H-10000; methyl phenyl silicone oils, such as KF50-100, KF54, and KF56; and methyl hydrogen silicone oils, such as KF99 and KF9901.

Modified Silicone Oil

Modified silicone oil is silicone modified by introducing a functional group into at least a portion of the terminal and side chain of dimethyl silicone. That is, the modified silicon oil corresponds to any one of both end type modified silicone, one end type modified silicone, side chain type modified silicone, and side chain both end type modified silicone.

Examples of the modified silicone oil include compounds having polydimethylsiloxane skeletons represented by Chemical Formulae (7) to (10) below.

[Chemical formula 7]

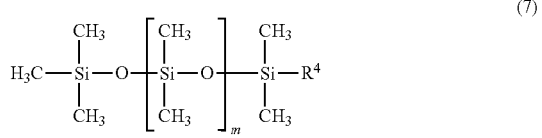
(7)

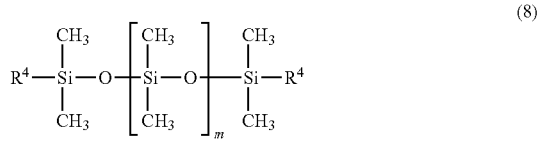
(8)

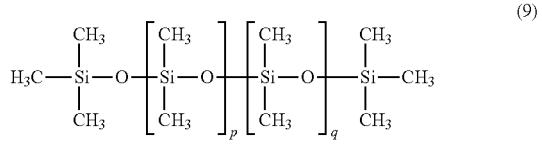
(9)

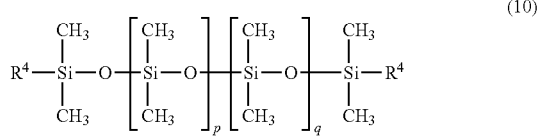
(10)

In Chemical Formulae (7) and (8), m is an integer of 1 or more, preferably an integer of 10 to 1,000, and more preferably 20 to 500. In Chemical Formulae (9) and (10), p is an integer of 1 or more, preferably an integer of 10 to 1,000, and more preferably 20 to 500, and q is an integer of 1 or more, preferably an integer of 10 to 1,000, and more preferably 20 to 500. In Chemical Formulae (7) to (10), $R^4$ is a functional group capable of introducing a carbinol group, an epoxy group, an amino group, an acryl group, a methacryl group, a carboxyl group, a phenol group, a mercapto group, an alkyl group, an aralkyl group, a diol, a silanol group, a polyether, a carboxylic acid anhydride, a higher fatty acid ester, a higher fatty acid amide, and a methylstyryl group. R may be a hydroxyl group in the case of introducing a silanol group.

In the case where $R^4$ is a functional group capable of introducing a polyether, $R^4$ can be represented by Chemical Formula (11) below.

[Chemical formula 8]

(11)

In Chemical Formula (11), $R^5$ is an organic group such as an alkylene group, and $R^6$ is a hydrogen atom, an aryl group, or a linear or branched alkyl group which may be substituted with a cycloalkyl group. In a and b, a is an integer of 0 to 30, b is an integer of 0 to 30, and a condition of $60 \geq a+b \geq 1$ is satisfied.

The functional group equivalent of modified silicone oil is not particularly limited, but, for example, is 1 g/mol to 100,000 g/mol, and preferably 10 g/mol to 5,000 g/mol.

In the case where modified silicone is modified by a functional group capable of introducing a hydroxyl group of a carbinol group, a phenol group, and a polyether, the hydroxyl value of the modified silicone is preferably 20 mgKOH/g to 500 mgKOH/g.

Examples of these modified silicone oils include commercially available products manufactured by Shin-Etsu Chemical Co., Ltd. Examples of these commercially available products include carbinol-modified silicone oils, such as X-22-4039, X-22-4015, KF6000, KF6001, KF6002, KF6003, and X-22-170DX; epoxy-modified silicone oils, such as X-22-163A, X-22-163B, X-22-163C, X-22-2000, X-22-4741, KF1005 and X-22-169B, and X-22-173DX; amino-modified silicone oils, such as KF393, KF865, X-22-9409, X-22-3939A, and X-22-161B; acryl-modified silicone oils, such as X-22-2445 and X-22-1602; methacryl-modified silicone oils, such as X-22-164B and KF2012; carboxyl-modified silicone oils, such as X-22-3701E and X-22-X-22-162C; phenol-modified silicone oil, such as KF2200; mercapto-modified silicone oils, such as KF2001 and X-22-167B; alkyl-modified silicone oils, such as KF414 and KF4003; aralkyl-modified silicone oils, such as KF410 and X-22-1877; diol-modified silicone oils, such as X-22-176DX and X-22-176GX-A; polyether-modified silicone oils, such as X-22-4272, KF945, KF6011, KF6123, and X-22-2516; and silanol-terminated silicone oils, such as X-21-5841 and KF9701.

The modified silicon oil can be appropriately selected depending on the kind of thermoplastic resins used in an adhesive. For example, in the case where hydrocarbon resins and elastomers are used as the thermoplastic resins, it is more preferable that silicone oil modified by introducing a functional group having high polarity, such as a carbinol group, an epoxy group, an amino group, an acryl group, a methacryl group, a carboxyl group, a phenol group, a mercapto group, a silanol group, a diol, or a polyether, is used as the release agent.

An elastomer including a hydrocarbon resin and a hydrogenated styrene elastomer is provided with a chemical structure having low polarity. Therefore, if modified silicone oil, into which a functional group having high polarity is introduced, is combined with the elastomer, it is possible to more appropriately exude the modified silicone oil onto the surface of the first adhesive layer 3. Accordingly, it is possible to obtain an adhesive that can more appropriately adjust the adhesiveness in both the interface between the first adhesive layer 3 and the substrate 1 and the interface between the first adhesive layer 3 and the support plate 2 in the laminate 10 shown in (e) of FIG. 1.

That is, if the modified silicone oil, into which a functional group having high polarity is introduced, is combined with the elastomer, it is possible to appropriately adjust the adhesiveness of an adhesive having high heat resistance, such as an elastomer including a hydrocarbon resin and a hydrogenated styrene elastomer.

Further, as the release agent, dimethyl silicone oil and modified silicone oil into which a functional group having low polarity such as an alkyl group, a phenyl group or an aralkyl group is introduced can also be used. That is, the silicone of these dimethyl silicone oil and modified silicone oil may be appropriately selected and used depending on the polarity of a thermoplastic resin and a plasticizer used in an adhesive.

The kinetic viscosity of dimethyl silicone oil or modified silicone oil at 25° C. is preferably 20 mm$^2$/s or more, more preferably 40 mm$^2$/s or more, and most preferably 60 mm$^2$/s or more. If the kinetic viscosity of dimethyl silicone oil or modified silicone oil at 25° C. is 20 mm$^2$/s or more, it is possible to prevent silicone oil from being evaporated. Therefore, for example, an adhesive can be used even in a laminate treated at a high temperature of 160° C. or higher.

Further, dimethyl silicone oil or modified silicone oil may be mixed with a thermoplastic resin. In this case, the kinetic viscosity of dimethyl silicone oil or modified silicone oil at 25° C. is not particularly limited, but may be 1,000,000 mm$^2$/s or less. If dimethyl silicone oil or modified silicone oil having a kinetic viscosity of 1,000,000 mm$^2$/s or less at 25° C. is used, it can be appropriately mixed with a thermoplastic resin, and thus the adhesiveness of an adhesive layer can be adjusted.

The combined amount of dimethyl silicone oil or modified silicone oil with respect to the total amount of a thermoplastic resin may be appropriately adjusted depending on the kind of a thermoplastic resin and the kind of a release agent. Therefore, the combined amount thereof is not particularly limited, but, for example, preferably, a release agent is combined in an amount of 0.01% by weight to 10% by weight with respect to the total amount of a thermoplastic resin, more preferably, is combined in an amount of 0.1% by weight to 5% by weight with respect to the total amount of a thermoplastic resin, and most preferably, is combined in an amount of 1% by weight to 3% by weight with respect to the total amount of a thermoplastic resin. If dimethyl silicone oil or modified silicone oil is combined in an amount of 0.01% by weight to 10% by weight with respect to the total amount of a thermoplastic resin, the substrate 1 and the support plate 2 can be appropriately bonded to each other. Further, even when a release layer is not formed on the support plate 2, it is possible to obtain an adhesive capable of forming a laminate that can easily peel the support plate 2 from the substrate 1.

In the release agent such as dimethyl silicone oil and modified silicone oil, it is preferable to use one having specific gravity closed to that of a mixture of a thermoplastic resin and a solvent. Thus, it is possible to make the dispersibility of the release agent into an adhesive composition good.

Cured Product of Modified Silicone Oil

A cured product of modified silicone oil may be used in the release agent. Even when the cured product of modified silicone oil is added to an adhesive, the adhesiveness of an adhesive can be appropriately adjusted.

The cured product of modified silicone oil can be obtained by reacting a functional group introduced into modified silicon oil with a functional group of another modified silicone oil. For example, the cured product of modified silicone oil can be a cured product obtained by reacting amine-modified silicone oil or mercapto-modified silicone oil with epoxy-modified silicone oil.

In addition, for example, the cured product of modified silicone oil can be a cured product obtained by reacting catalyst-curing or photocuring silicone oil. Examples of the catalyst-curing silicone oil include KF-705F-PS, KS-705F-PS-1, and KS-770-PL-3, manufactured by Shin-Etsu Chemical Co., Ltd. Examples of the photocuring silicone oil include KS-720 and KS744-PL3, manufactured by Shin-Etsu Chemical Co., Ltd.

In the cured product of modified silicone oil, for example, a cure product is obtained by reacting isocyanate with modified silicone oil into which a functional group having active hydrogen of carbinol-modified silicone oil or amino-modified silicone oil is introduced, and then this cured product may be used as a release agent.

Other Components in First Adhesive Layer 3

The first adhesive layer 3 may further contain other materials having miscibility in addition to the release agent within a range that does not impair essential properties. For example, commonly-used various additives, such as additional resins for improving the performance of the adhesive, a plasticizer, an adhesion auxiliary agent, a stabilizer, a colorant, a thermal polymerization inhibitor, and a surfactant, can be further used.

Laminating Process

As shown in (e) of FIG. 1, in the laminating process, a laminate 10 is formed.

In the laminating process, the substrate 1 provided with the first adhesive layer 3 and the support plate 2 provided with the release layer 4 are superimposed in order of the substrate 1, the first adhesive layer 3, the release layer 4, and the support plate 2 under a vacuum condition while heating the adhesive layer 3. Then, pressure force is applied by tucking the superimposed substrate 1 and support plate 2 by a pair of plate members provided with a bonding apparatus for bonding a laminate 10. Thereby, the laminate 10 can be formed. The conditions for forming the laminate 10 may be appropriately adjusted depending on the kind of an adhesive layer and the size of a laminate.

Laminate 10

As shown in (e) of FIG. 1, the laminate 10 is configured such that the substrate 1 and the support plate 2 provided with the release layer 4 on the entire periphery of the surface of the side facing the substrate 1 are laminated through the first adhesive layer 3. That is, the laminate 10 is configured such that the first adhesive layer 3 and the release layer 4 are bonded to each other over the entire end of periphery of the support plate 2.

In the laminate 10, the first adhesive layer 3 contains silicone oil as a release agent, and thus the adhesive force of the first adhesive layer 3 is adjusted such that the substrate 1 and the support plate 2 are appropriately separated. Further, the laminate 10 includes the release layer 4 formed by polymerizing reactive polysilsesquioxane (and crosslinkable group-containing siloxane, as needed), thereby improving chemical resistance and heat resistance. The release layer 4 formed by polymerizing reactive polysilsesquioxane has high adhesiveness to the first adhesive layer 3 containing silicone oil as a release agent. In the case where the first adhesive layer 3 and the release layer 4 are configured in this way, it is possible to improve the adhesiveness between the adhesiveness-adjusted first adhesive layer 3 and the support plate 2 while preventing the release layer 4 from being altered by chemicals at the time of performing various treatments on the substrate 1 of the laminate 10. Therefore, it is possible to appropriately prevent delamination (interlayer peeling) from occurring between the first adhesive layer 3 and the support plate 2.

As shown in (e) of FIG. 1, the substrate 1 of the laminate 10, as an example, is thinning-treated to a predetermined thickness by a grinding unit such as a grinder. Further, for example, in the TSV (Through Silicone Via) process, the laminate 10 is configured such that a through electrode can be formed through a photolithography process or a chemical mechanical polishing (CMP) process. The laminate 10 has chemical resistance to various chemicals used in the TSV process. Further, the laminate 10 is configured to prevent the delamination caused by applying a stress to the laminate 10 in the CMP process due to the high adhesiveness between the first adhesive layer 3 and the support plate 2.

Further, if the laminate 10 is provided with an adhesive layer 3 containing a polysulfone resin, for example, this laminate 10 can be appropriately used even in the high-temperature process in which the laminate 10 is treated by annealing at a high temperature of 300° C. or higher.

Further, in the laminate 10, the substrate 1 and the support plate 2 are made of silicon, thereby making the thermal expansion coefficients of the substrate 1 and the support plate 2 to be substantially equal to each other. Therefore, when the laminate 10, for example, is heated in the TSV process or high-temperature process, it is possible to reduce the distortion caused by the difference in thermal expansion coefficient between the substrate 1 and the support plate 2. Accordingly, it is possible to perform various processes on the substrate 1 with high accuracy.

Method of Separating Support According to First Embodiment

Next, a method of separating a support according to an embodiment (first embodiment) of the present invention will be described. The method of separating a support according to the present embodiment includes: a laminate preparing process of preparing a laminate 10 by the method of preparing a laminate according to the first embodiment of the present invention (refer to (a) to (e) of FIG. 1); a preliminary treatment process of reducing the adhesiveness of the release layer 4 by irradiating the release layer 4 with infrared ray after the laminate preparing process and thus altering the release layer 4 (refer to (f) and (g) of FIG. 1); and a separation process of separating the support plate 2 from the substrate 1 by fixing one of the substrate 1 and the support plate 2 and applying a force to the other thereof (refer to (h) and (i) of FIG. 1). Since this laminate preparing process shown in (a) to (e) of FIG. 1 is the same as the laminate preparing process in the method of preparing a laminate 10 according to the first embodiment, a description thereof will be omitted.

Preliminary Treatment Process

The preliminary treatment process is performed after performing various processes with respect to the substrate 1 in the laminate 10.

As shown in (f) of FIG. 1, in the preliminary treatment process, infrared ray L is applied toward the release layer 4 through the support plate 2, thereby altering the release layer 4. The release layer 4' shown in (g) of FIG. 1 indicates the release layer 4 altered by irradiation with infrared ray L.

In the present specification, the release layer "being altered" means a phenomenon in which the release layer can be destroyed by receiving a slight external force or the adhesion force between the release layer and a layer in contact with the release layer is lowered. As the result of alteration of the release layer caused by absorbing infrared ray, the release layer loses strength or adhesiveness before irradiation with infrared ray. That is, the release layer becomes brittle by absorbing infrared ray. The alteration of the release layer means that the release layer causes decomposition, change of configuration, or dissociation of a functional group by energy of absorbed infrared ray. The alteration of the release layer occurs as a result of absorbing infrared ray.

Thus, for example, it is possible to easily separate the support plate from the substrate by altering the release layer such that the release layer is destroyed only by lifting the support plate. More specifically, for example, one of the substrate and the support plate in the laminate is fixed to a mounting stage by a support separation apparatus, and the other thereof is held and lifted by an adsorption pad (holding unit) provided with an adsorption unit, thereby separating the support plate from the substrate. Further, the support plate may be separated from the substrate by applying a force by gripping the chamfered portion of end of periphery of the support plate using a separation plate provided with a clamp (claw portion). Moreover, for example, the support plate may be peeled from the substrate in the laminate by a support separation apparatus provided with a peeling unit for supplying a peeling solution for peeling an adhesive. The peeling solution is supplied to at least a part of end of the periphery of an adhesive layer in the laminate by the peeling unit to swell the adhesive layer in the laminate, so that a force is concentrated to the release layer from the place where the adhesive layer is swelled, thereby applying the force to the substrate and the support plate. Therefore, it is possible to appropriately separate the support plate from the substrate.

The force applied to the laminate may be appropriately adjusted depending on the size of the laminate. The force is not particularly limited, but may be about 0.1 kgf to 5 kgf if the laminate has a diameter of about 300 mm, and thus it is possible to appropriately separate the support plate from the substrate.

Irradiation with Infrared Ray

As shown in (f) of FIG. 1, in the preliminary treatment process, the laminate 10 is mounted on a mounting stage (not shown) such that the substrate 1 is located at the bottom side of the laminate 10, and infrared ray L is applied toward the release layer 4 through the support plate 2, so as to alter the release layer 4. Accordingly, the release layer 4 provided on the entire periphery of the support plate 2 in the laminate 10 is altered, so as to lower the adhesive force of the release layer 4.

In the preliminary treatment process, the mounting stage for mounting the laminate 10 is preferably a stage capable of fixing the laminate 10 by adsorption using a pressure reducing unit. As an example of the mounting stage, there is exemplified a fixable or movable stage having a porous portion not to damage a thinning-treated wafer. The pressure reducing unit is not particularly limited, but, for example, is preferably an air-driven vacuum generator.

The laminate 10, as an example, may be mounted on the mounting stage, such as a stage or a spin chuck, having the above-described mechanism, through a dicing tape having a dicing frame.

As the infrared ray L applied to the release layer 4, there can be exemplified infrared ray (0.78 µm to 1,000 µm), preferably far-infrared ray (3 µm to 1,000 µm), and more preferably light having a wavelength of 9 µm to 11 µm. As the light having a wavelength of 9 µm to 11 µm, there is exemplified a $CO_2$ laser. When the $CO_2$ laser is used, the $CO_2$ laser can transmit silicone, and can thus be absorbed in the release layer 4 which is a polymer of reactive polysilsesquioxane. Thus, the release layer 4 can be altered, and thus can become brittle.

According to laser light irradiation conditions in the preliminary treatment process, the average output value of a laser light is preferably 1.0 W to 5.0 W, and more preferably 3.0 W to 4.0 W. The repetition frequency of laser light is preferably 20 kHz to 60 kHz, and more preferably 30 kHz to 50 kHz. The scanning speed of laser light is preferably 100 mm/s to 10,000 mm/s. Thus, it is possible to set the laser light irradiation conditions to appropriate conditions for altering the release layer 4. Further, the beam spot diameter of pulsed light and the irradiation pitch of pulsed light may be a pitch at which the release layer 4 can be altered without overlapping adjacent beam spots each other.

In the preliminary treatment process, laser light is emitted toward the release layer 4 formed to a width within a predetermined range from the end of the periphery of the support plate 2 toward the inside thereof. Therefore, the irradiation range of laser light may be determined depending on the width of the release layer 4 formed from the end of the periphery of the support plate 2 toward the inside thereof. For example, laser light may be applied to the release layer 4 having preferably a width within a range of 0.5 mm to 10 mm, more preferably a width within a range of 1 mm to 5 mm, and most preferably a width within a range of 2 mm to 3 mm, from the end of the periphery of the support plate 2 toward the inside thereof. If laser light is applied to the release layer having a width within a range of 0.5 mm to 10 mm from the end of the periphery of the support plate 2 toward the inside thereof, the irradiation range of the laser light, having transmitted the support plate 2 and the release layer 4, to the substrate 1 can be narrowed. Further, since the laser light applied through the support plate 2 can be absorbed in the release layer 4, it is possible to prevent the laser light from transmitting the release layer 4, reaching the substrate 1 and damaging the elements formed on the substrate 1. As a result, thereafter, it is possible to prepare a semiconductor chip from the substrate 1 in a high yield by performing a desired treatment.

Separation Process

As shown in (h) and (i) of FIG. 1, in the separation process, the substrate 1 and the support plate 2 are separated by fixing the side of the substrate 1 in the laminate 10 and applying a force to the support plate 2.

As shown in (h) of FIG. 1, in the separation process, the chamfered portion of end of periphery of the support plate 2 is gripped by a separation plate 50 provided with a clamp (gripping member) 30 such as a claw portion to lift the support plate 2. It is more preferable that the separation plate 50 is provided with a floating joint (not shown) moving to take a circular orbit parallel to the plane of the laminate 10 and an arcuate orbit perpendicular to the plane of the laminate 10.

In the laminate 10, since the release layer 4' altered by irradiation with infrared ray L becomes brittle, if the chamfered portion of end of periphery of the support plate 2 is gripped by the clamp 30 to apply a force to the support plate 2, first, the release layer 4' in the laminate 10 is destroyed. For this reason, the force applied by the separation plate 50 is concentrated toward the surface on which the support plate 2 and the first adhesive layer 3 are bonded to each other, the surface being an inner surface than the surface on which the destroyed release layer 4' exists. Since the first adhesive layer 3 in the laminate 10 contains a release agent, the adhesiveness of the first adhesive layer 3 to the support plate 2 is adjusted. Therefore, even though a force is not excessively applied to the laminate 10, the force can be concentrated to the surface on which the support plate 2 and the first adhesive layer 3 are bonded to each other, and thus the substrate and the support plate 2 can be appropriately separated. Accordingly, it is possible to prevent the substrate 1 from being damaged at the time of separating the substrate 1 and the support plate 2 (refer to (i) of FIG. 1).

If a force is applied to the laminate 10 from the separation plate 50 through the floating joint, when the force is concentrated to the destroyed portion of the release layer 4', the floating joint is operated, and thus the separation plate 50 is tilted. Along with this, the support plate 2 is also tilted. Thereby, it is possible to prevent excessive force from being applied to a portion of the support plate 2 and the substrate 1. Therefore, it is possible to more appropriately peel the support plate 2 from the substrate 1 while preventing the support plate 2 and the substrate 1 from being damaged by excessive force. Accordingly, it is possible to more appropriately separate the substrate 1 and the support plate 2.

Thereafter, the residues of the first adhesive layer 3 and the release layer 4' may be removed from the substrate 1, from which the support plate 2 is separated, by the above-described solvent.

Method of Preparing a Laminate According to Second Embodiment

The method of preparing laminate according to the present invention is not limited to the above-described embodiment. For example, a method of preparing a laminate 11 according to an embodiment (second embodiment) includes a release layer-forming process ((a) and (b) of FIG. 2), a first adhesive layer-forming process ((c) of FIG. 2), a second adhesive layer-forming process ((d) and (e) of FIG. 2), and a laminating process ((f) of FIG. 2). In the second adhesive layer-forming process, a second adhesive layer 3a not containing a release agent is formed on the substrate 1. Here, since the release layer-forming process ((a) and (b) of FIG. 2) is the same as the release layer-forming process included in the method of preparing a laminate 10 according to the first embodiment, descriptions thereof will be omitted.

First Adhesive Layer-Forming Process (Second Embodiment)

Figure 2:
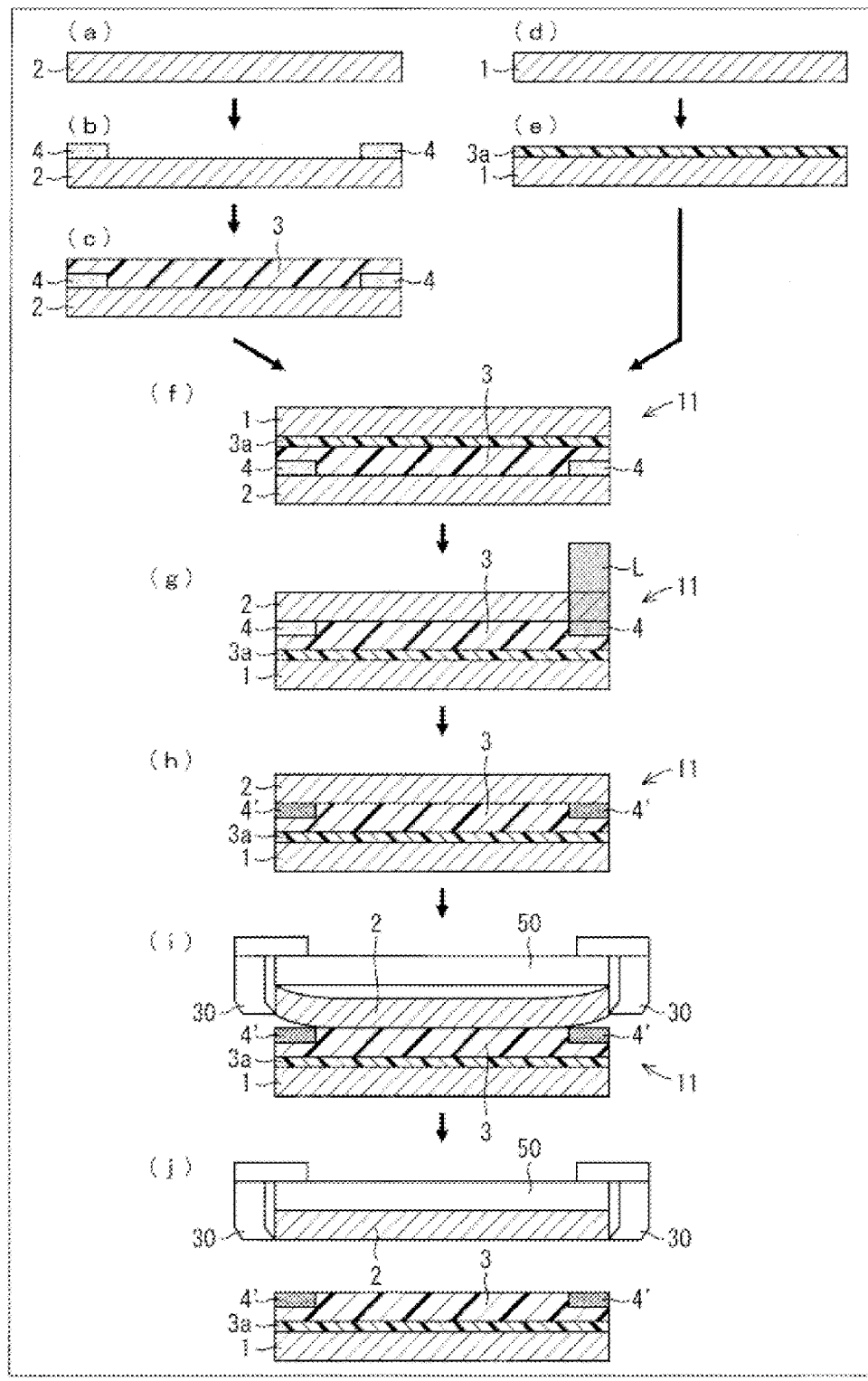
FIG. 2 is a schematic view illustrating a method of preparing a laminate and a method of separating a support according to a second embodiment of the present invention.

As shown in (c) of FIG. 2, in the first adhesive layer-forming process, a first adhesive layer 3 containing a release agent is formed on the surface of the support plate (support) 2, the surface being provided with the release layer 4 on the periphery thereof. Therefore, even in the first adhesive layer-forming process according to the present embodiment, the support plate 2 and the first adhesive layer 3 containing a release agent are bonded to each other on the inner surface than the surface on which the release layer 4 is formed. Here, since an adhesive used for forming the first adhesive layer 3 and a method of applying the adhesive are the same as those in the first adhesive layer-forming process included in the method of preparing a laminate 10 according to the first embodiment, descriptions thereof will be omitted.

In the first adhesive layer-forming process, the thickness of the first adhesive layer 3 may be appropriately set depending on the kind of the substrate 1 and the support plate 2 to be bonded with each other, the treatment to be carried out to the substrate 1 after bonding, and the film thickness of the second adhesive layer 3a.

Second Adhesive Layer-Forming Process

In the second adhesive layer-forming process, an adhesive not containing a release agent is applied onto the substrate 1 shown in (d) of FIG. 2, thereby forming a second adhesive layer 3a on the substrate 1 (refer to (e) of FIG. 2). As the substrate 1 provided with the second adhesive layer 3a, a substrate the same as the substrate made of silicon used in the first embodiment is used.

Since the adhesive used for forming the second adhesive layer 3a is the same as the adhesive used for the first adhesive layer except that a release agent is not combined, a description thereof will be omitted. Further, since the method of applying the adhesive used for forming the second adhesive layer 3a can use the same method as the first adhesive layer forming method, a description thereof will be omitted.

The thickness of the second adhesive layer 3a may be appropriately set depending on the kind of the substrate 1 and the support plate 2 to be bonded with each other, the treatment to be carried out to the substrate 1 after bonding, and the film thickness of the first adhesive layer 3 formed on the support plate 2. That is, when the laminate 11 is formed, the sum of the film thickness of the first adhesive layer 3 and the film thickness of the second adhesive layer 3a is preferably within a range of 10 μm to 150 μm, and more preferably with a range of 20 μm to 120 μm.

Laminating Process

As shown in (f) of FIG. 2, in the laminating process, a laminate 11 is formed.

In the laminating process, under a vacuum condition, the substrate 1 and the support plate 2 are superimposed through the second adhesive layer 3a, the first adhesive layer 3, and the release layer 4 while heating the support plate 2 provided with the release layer 4 and the first adhesive layer 3 on one side thereof and the substrate 1 provided with the second adhesive layer 3a. The conditions for forming the laminate 11 may be appropriately adjusted depending on the kind of an adhesive layer and the size of a laminate.

Laminate 11

As shown in (f) of FIG. 2, the laminate 11 is configured such that the substrate 1 and the support plate 2 provided with the release layer 4 on the periphery of the surface of the side facing the substrate 1 are laminated through the first adhesive layer 3 containing a release agent and the second adhesive layer 3a not containing the release agent. The laminate 11 is configured such that the first adhesive layer 3 formed on the surface of the support plate 2, the surface being provided with the release layer 4 over the entire periphery thereof, and the second adhesive layer 3a formed on the substrate 1 are laminated to overlap each other.

The laminate 11, similarly to the laminate 10, is configured such that the first adhesive layer 3 contains a release agent, and thus the adhesive force of the first adhesive layer 3 is adjusted such that the substrate 1 and the support plate 2 are appropriately separated. The laminate 11 is configured such that the adhesiveness between the first adhesive layer 3 and the substrate 1 is improved by the second adhesive layer 3a not containing a release agent. Thus, in the laminate 11, it is possible to prevent delamination from occurring between the first adhesive layer 3 and the substrate 1.

The laminate 11, similarly to the laminate 10, includes the release layer 4 formed by polymerizing reactive polysilsesquioxane (and crosslinkable group-containing siloxane, as needed), thereby improving chemical resistance and heat resistance.

In the laminate 11 shown in (f) of FIG. 2, similarly to the laminate 10, for example, in the TSV (Through Silicone Via) process, the laminate 10 is configured such that a through electrode can be formed through a photolithography process or a chemical mechanical polishing (CMP) process. The laminate 11 has chemical resistance to various chemicals used in the TSV process. Further, the laminate 11 is configured to prevent the delamination caused by applying a stress to the laminate 11 in the CMP process due to high adhesiveness between the first adhesive layer 3 and the support plate 2 and high adhesiveness between the second adhesive layer 3a and the substrate 1.

Method of Separating Support According to Second Embodiment

A method of separating a support according to a second embodiment includes: a laminate preparing process of preparing a laminate 11 by the above-described method of preparing a laminate according to the second embodiment (refer to (a) to (f) of FIG. 2); a preliminary treatment process (refer to (g) to (h) of FIG. 2); and a separation process (refer to (i) to (j) of FIG. 2).

Here, since the laminate preparing process of preparing a laminate 11 is the same as the laminate preparing process in the method of preparing a laminate 11 according to the second embodiment, a description thereof will be omitted. In addition, since the preliminary treatment process shown in (g) and (h) of FIG. 2 is the same as the preliminary treatment process included in the method of separating a support according to the first embodiment, a description thereof will be omitted.

Separation Process

As shown in (i) and (j) of FIG. 2, in the separation process, the substrate 1 and the support plate 2 are separated by fixing the side of the substrate 1 in the laminate 11 and applying a force to the support plate 2.

Even in the laminate 11, similarly to the case of the laminate 10, the force applied by the separation plate 50 is concentrated toward the surface on which the support plate 2 and the first adhesive layer 3 are bonded to each other, the surface being an inner surface than the surface on which the destroyed release layer 4' exists. Since the first adhesive layer 3 in the laminate 11 contains a release agent, the adhesiveness of the first adhesive layer 3 to the support plate 2 is adjusted. Therefore, even though a force is not excessively applied to the laminate 11, the force can be concentrated to the surface on which the support plate 2 and the first adhesive layer 3 are bonded to each other, and thus the substrate 1 and the support plate 2 can be appropriately separated. Accordingly, it is possible to prevent the substrate 1 from being damaged at the time of separating the substrate 1 and the support plate 2 (refer to (i) of FIG. 2).

In the laminate 11, the adhesiveness between the first adhesive layer 3 and the substrate 1 is improved by the second adhesive layer 3a. Therefore, in the separation process included in the method of separating a support according to the present embodiment, it is possible to separate the substrate 1 and the support plate 2 in a state where both the first adhesive layer 3 and the second adhesive layer 3a are bonded to one side of the substrate 1. Accordingly, when the substrate 1 and the support plate 2 are separated, it is possible to separate an element formed on the substrate 1 without being damaged.

Thereafter, the residues of the first adhesive layer 3, the second adhesive layer 3a, and the release layer 4' may be removed from the substrate 1, from which the support plate 2 is separated, by the above-described solvent.

Method of Preparing Laminate According to Another Embodiment

The method of preparing a laminate according to the present invention is not limited to the above-described embodiments (first embodiment and second embodiment). In a method of preparing a laminate according to another embodiment, for example, the materials for forming the release layer in the release layer-forming process are not limited to the above-described reactive polysilsesquioxane and crosslinkable group-containing siloxane. As the materials for forming the release layer, for example, compounds having a known infrared ray-absorbing structure, and infrared ray-absorbing materials can be used.

Examples of the infrared ray-absorbing structure include a carbon-halogen bond, a Si-$A^1$ bond ($A^1$ is, H, C, O or halogen), a P-$A^2$ bond ($A^2$ is H, C, or O), and a Ti—O bond. Examples of the compound having such a structure include compounds having a nonreactive polysilsesquioxane skeleton or a siloxine skeleton. The infrared ray-absorbing material may be configured to be altered by absorbing infrared ray. As the infrared ray-absorbing material, for example, carbon black, iron particles, or aluminum particles can be appropriately used. Thus, the release layer can be appropriately altered by irradiation with infrared ray through the support made of silicon. Accordingly, a method of separating a support according to an embodiment can be appropriately carried out.

In the method of preparing a laminate according to another embodiment, in the release layer-forming process, for example, a release layer to be altered by irradiation with infrared ray is formed using oxygen and silane gas such as $SiH_4$ through an atmospheric pressure plasma chemical vapor deposition (CVD) method or a low-pressure plasma chemical vapor deposition (CVD) method. Thus, it is possible to form a release layer having a $SiO_2$ structure capable of absorbing infrared ray. In the method of preparing a laminate according to the present invention, a method for forming a release layer is not limited if the release layer can be formed on the only the periphery of a substrate or a support.

In the method of preparing a laminate according to another embodiment, any substrate of a ceramic substrate, a thin film substrate, and a flexible substrate is used as the substrate, and a support plate made of silicon is used as the support. According to the above embodiment, the release layer, which is formed on the periphery of the surface of a support made of silicon, the surface facing the substrate 1, can be irradiated with infrared ray. Accordingly, a method of separating a support according to an embodiment of the present invention can be appropriately carried out.

In the method of preparing a laminate according to another embodiment, a substrate made of silicon is used as the substrate, and a support made of glass or acryl-based resin is used as the support. According to the above embodiment, the release layer is irradiated with infrared ray through a support made of silicon. Accordingly, even in the method of preparing a laminate according to present embodiment, a method of separating a support according to an embodiment can be appropriately carried out. In the method of separating a support according to the present invention, if one of the substrate and the support is made of silicon, the material constituting the other thereof is not limited.

In the method of preparing a laminate according to another embodiment, the release layer is configured to be provided on only the periphery of the surface of the substrate, the surface facing the support. Even in the above configuration, the release layer can be altered without applying infrared ray to the inner side of a portion of the substrate, on which the release layer is formed. Accordingly, it is possible to appropriately prevent an element formed at the inner side of a portion of the substrate, on which the release layer is formed, from being damaged by irradiation with infrared ray.

Hereinafter, embodiments of the present invention will be described in more detail with reference to the following Examples. Of course, the present invention is not limited to each of the above-described embodiments, and may be variously modified within the scope of claims, and an embodiment obtained by the appropriate combination of technical means disclosed in different embodiments is also included in the technical scope of the present invention.

EXAMPLES

Separability Evaluation 1 of Support (First Embodiment)

As Examples 1 and 2, Comparative Examples 1 and 2, and Reference Example 1, laminates in which release layers and adhesive layers are different were fabricated, and the separability of a support in each of the laminates was evaluated. The configurations and fabrication methods of the laminates of Examples 1 and 2, Comparative Examples 1 and 2, and Reference Example 1 are as follows.

Example 1

As Example 1, a semiconductor wafer substrate, and a silicon support plate provided with a release layer on only the periphery of surface thereof facing the semiconductor wafer substrate were laminated through a first adhesive layer containing a release agent, so as to fabricate a laminate.

Formation of Release Layer

In the laminate of Example 1, a release layer was formed using a release layer-forming composition A prepared by dissolving reactive polysilsesquioxane SR-21 (manufactured by Konishi Chemical Industry Co., Ltd.) in a solvent PGMEA such that the content of SR-21 is 20% by weight.

SR-21 is reactive polysilsesquioxane in which a functional group R— in Formula (1) below is a phenyl group, and an end group R'O— is HO—.

[Chemical formula 9]

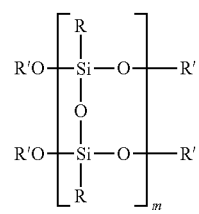

(1)

In Example 1, a release layer-forming composition A, as a solution of SR-21, was applied from the end of periphery of a silicon support plate of 12 inches toward the inside thereof only within a range of width of 5 mm (only the entire periphery) using an EBR nozzle by a spin coating method. Subsequently, the silicon support plate was heated for 3 minutes under temperature conditions of 90° C., 160° C., and 220° C., respectively, thereby forming a release layer having a film thickness of 5 μm of Example 1 (release layer-forming process).

Formation of First Adhesive Layer

In order to form a first adhesive layer, an adhesive a containing a thermoplastic resin and a release agent was prepared.

In the adhesive a, as the thermoplastic resin, TUFTEC H1051 (trade name) manufactured by Asahi Kasei Corporation (SEBS, hydrogenated styrene-based thermoplastic elastomer, styrene content 42%, Mw=78,000), SEPTON 2002 (trade name) manufactured by Kuraray Co., Ltd.

(SEPS: styrene-isoprene-styrene block), and TOPAS™ (trade name) manufactured by Polyplastics Co., Ltd. (cycloolefin copolymer, ethylene-norbornene copolymer, Mw=10,000, Mw/Mn=2.08, norbornene:ethylene=50:50 (weight ratio)) were used.

As the release agent, KF-6003 (manufactured by Shin-Etsu Chemical Co., Ltd.) was used.

In the adhesive a, "IRGANOX 1010 (trade name)" manufactured by BASF Corporation was used as a thermopolymerization inhibitor (additive), decahydronaphthalene was used as a main solvent, and butyl acetate was used as an entrainer.

First, a thermoplastic resin, in which H1051, SEPTON 2002, and TOPAS™ were mixed in a weight ratio of 55:45:10, was dissolved in a solvent, in which decahydronaphthalene and butyl acetate were mixed in a weight ratio of 15:1, to a concentration of 28% by weight. Subsequently, IRGANOX 1010 was added in an amount of 1% by weight with respect to the solid content of the thermoplastic resin. Further, KF-6003 was added in an amount of 2% by weight with respect to the solid content of the thermoplastic resin.

Subsequently, the adhesive a was applied onto a semiconductor wafer substrate (12 inch silicon substrate) by a spin coating method, and was baked for 4 minutes at each of 90° C., 160° C., and 220° C. under a vacuum condition, so as to form a first adhesive layer of 50 μm (first adhesive layer-forming process).

Thereafter, the semiconductor wafer substrate, the first adhesive layer, the release layer, and the silicon support plate were overlapped in this order, and a pressure force of 2,000 kg is applied thereto at 240° C. for 5 minutes under a vacuum condition, thereby fabricating the laminate of Example 1 (laminating process).

Example 2

As Example 2, a laminate was fabricated under the same conditions as in Example 1, except that a release layer was formed using a release layer-forming composition B containing reactive polysilsesquioxane and a crosslinkable group-containing siloxane compound.

In Example 2, the release layer-forming composition B, in which reactive polysilsesquioxane and a crosslinkable group-containing siloxane compound were combined in a ratio of 50:50, was used in the formation of the release layer. The reactive polysilsesquioxane used in the release layer-forming composition B is SR-21, and the crosslinkable group-containing siloxane compound used in the release layer-forming composition B is crosslinkable group-containing siloxane A represented by Formula (12) below (mass average molecular weight 3,000, in Formula (12), m=70 mol %, n=30 mol %). Further, the release layer-forming composition B was combined with a thermal acid generator K-PURE CXC-1821 (manufactured by KING INDUSTRY CO., LTD.).

[Chemical formula 10]

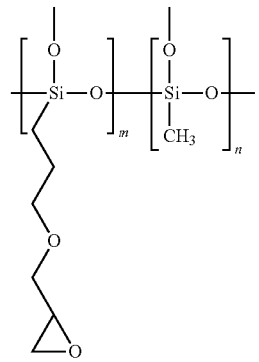

(12)

The release layer-forming composition B was dissolved in PGMEA such that the sum of SR-21 and crosslinkable group-containing siloxane A is 40% by weight, and was combined with K-PURE CXC-1821 such that the sum of SR-21 and crosslinkable group-containing siloxane A is 0.2% by weight.

In Example 2, an adhesive layer was formed by the adhesive a used in Example 1, and a laminate was fabricated using this adhesive layer.

Comparative Example 1

As Comparative Example 1, a semiconductor wafer substrate, and a silicon support plate provided with a release layer on the entire surface thereof facing the semiconductor wafer substrate were laminated through an adhesive layer not containing a release agent, so as to fabricate a laminate.

In the laminate of Comparative Example 1, a release layer was formed using the same release layer-forming composition A as that of Example 1 under the same heating conditions as those of Example 1. Further, an adhesive layer was formed using an adhesive (hereinafter, referred to as adhesive b) having the same composition as that of Example 1, except that KF-6003 was not combined.

Comparative Example 2

As Comparative Example 2, a semiconductor wafer substrate, and a silicon support plate not provided with a release layer were laminated through an adhesive layer not containing a release agent, so as to fabricate a laminate. In Comparative Example 2, an adhesive layer was formed by the adhesive b used in Comparative Example 1, and a laminate was fabricated using this adhesive layer.

Reference Example 1

As Reference Example 1, a semiconductor wafer substrate, and a silicon support plate not provided with a release layer were laminated through an adhesive layer not containing a release agent, so as to fabricate a laminate. In Reference Example 1, an adhesive layer was formed by the adhesive a used in Example 1, and a laminate was fabricated using this adhesive layer.

Separability Evaluation 1

A preliminary treatment process and a separation process were performed using the above laminates of Examples 1 and 2, Comparative Examples 1 and 2, and Reference Example 1, and the separability of the semiconductor wafer substrate and silicon support plate in each of the laminates was evaluated.

Preliminary Treatment Process

For each of the laminates of Examples 1 and 2, Comparative Examples 1 and 2, and Reference Example 1, a preliminary treatment process was performed by irradiating a release layer with infrared ray through a silicon support plate.

In the preliminary treatment process, the release layer was altered by irradiating the release layer with $CO_2$ laser beam through the silicon support plate using the $CO_2$ laser marker ML-Z9520-T (manufactured by Keyence Corporation) under conditions of a wavelength of 9.3 μm, an output of 20 W (100%), and a scanning speed of 500 mm/s. Further, in the preliminary treatment process, each of the laminates was irradiated with $CO_2$ laser beam within a range of 5 mm from the end of periphery of the silicon support plate toward the inside thereof.

Separation Process

For each of the laminates of Examples 1 and 2, Comparative Examples 1 and 2, and Reference Example 1, the semiconductor wafer substrate was mounted on a mounting stage, and was fixed by adsorption using a vacuum pump. Subsequently, the chamfered portion of end of periphery of the support was gripped by a clamp of a separation plate, the separation plate was lifted at a speed of 0.1 mm/s, and a force was applied to the laminate, so as to separate the semiconductor wafer substrate and the support.

In the evaluation of separability, a case where the semiconductor wafer substrate and the silicon support plate were separated by applying a force of 3 kg or less to the laminate is represented by "A", and a case where the semiconductor wafer substrate and the silicon support plate were separated by applying a force of 5 kg or less to the laminate is represented by "B". Further, a case where, in the preliminary treatment process, the semiconductor wafer substrate and the silicon support plate were not separated if the separation process is not performed after applying a force to a portion of the outer periphery of the adhesive layer in the laminate using a cutter blade and removing the force is represented by "C", and a case where, in the preliminary treatment process, the semiconductor wafer substrate and the silicon support plate were not separated even if the separation process is performed after applying a force to a portion of the outer periphery of the adhesive layer in the laminate using a cutter blade and removing the force is represented by "D".

The configurations and separability evaluation results of the laminates of Examples 1 and 2, Comparative Examples 1 and 2, and Reference Example 1 are shown in Table 1 below.

increased, and thus it was possible to separate the semiconductor wafer substrate and the silicon support plate by removing a part of the release layer of the laminate using a cutter "C". Further, in the laminate of Comparative Example 2 in which the release layer is not provided and the adhesive layer does not contain a release agent, it was not possible to separate the semiconductor wafer substrate and the silicon support plate "D".

In the laminates of Examples 1 and 2, the release layer formed on the entire periphery of the silicon support plate is altered by the preliminary treatment process, and thus a force can be concentrated to the surface on which the first adhesive layer containing a release agent is bonded to the silicon support plate in the separation process. Accordingly, it is determined that, in the laminates of Examples 1 and 2, the semiconductor wafer substrate and the silicon support plate can be appropriately separated, compared to in the laminates of Comparative Examples 1 and 2.

In contrast, in the laminate of Reference Example 1, the semiconductor wafer substrate and the silicon support plate can be appropriately separated by smaller force. However, it is determined that, in the laminates of Examples 1 and 2, the force required to separate the substrate and the support becomes large, compared to in the laminate of Reference Example 1, whereas the adhesiveness of the first adhesive layer in the periphery of the silicon support plate becomes high due to the formation of the release layer.

From the above results, it is clearly understood that, in the laminates of Examples 1 and 2, since the release layer is formed on only the entire periphery of the silicon support plate, the adhesiveness of the first adhesive layer is increased by the release layer, and the semiconductor wafer substrate and the silicon support plate can be appropriately separated.

Separability Evaluation 2 of Support

As Examples 3 to 5, laminates in which film thicknesses of release layers are different were fabricated, and the separability of a support in each of the laminates was evaluated.

In the laminates of Examples 3 to 5, each of the release layers was formed using the above release layer-forming composition A, and the first adhesive layer was formed using the adhesive a containing a release agent. In the release layer-forming process, each of the laminates was fabricated under the same conditions as in Example 1, except that the film thickness of the release layer was adjusted, and the

TABLE 1

|  | Adhesive | Release layer-forming composition | Release layer forming portion | Separability |
|---|---|---|---|---|
| Example 1 | a | A | Only entire periphery | B |
| Example 2 | a | B | Only entire periphery | B |
| Comparative Example 1 | b | A | Entire surface | C |
| Comparative Example 2 | b | — | — | D |
| Reference Example 1 | a | — | — | A |

As shown in Table 1, in the laminates of Examples 1 and 2, it was possible to separate the semiconductor wafer substrate and the silicon support plate without applying excessive force "B". In contrast, in the laminate of Comparative Example 1, since the release layer was formed on the entire surface, the adhesiveness to the adhesive layer was separability thereof was evaluated. The film thicknesses of the release layers and the evaluation results of separability in the laminates of Examples 3 to 5 are shown in Table 2 below. The separability evaluation of the laminates of Examples 3 to 5 were performed based on the same criteria as those described in the "separability evaluation 1".

TABLE 2

| | Adhesive | Release layer-forming composition | Release layer forming portion | Film thickness (μm) | Separability |
|---|---|---|---|---|---|
| | | | Release layer | | |
| Example 3 | a | A | Only entire periphery | 2 | A |
| Example 4 | a | A | Only entire periphery | 5 | A |
| Example 5 | a | A | Only entire periphery | 10 | B |

As shown in Table 2, from the evaluation results of the laminates of Examples 3 to 5, it could be found that the semiconductor wafer substrate and the silicon support plate can be separated by smaller force as the film thickness of the release layer decreases.

Evaluation of Light Transmittance in Release Layer

As Examples 6 to 9, the release layer formed using reactive polysilsesquioxane and a crosslinkable group-containing siloxane compound was formed on only the entire periphery of the silicon support plate (only within a range of width of 5 mm from the periphery of the silicon support plate of 12 inches toward the inside thereof), and laminates were fabricated using an adhesive containing a release agent. The separability of the laminates of Examples 6 to 9 and the transmittance of infrared ray in the release layer were measured.

The laminate of Example 6 was fabricated under the same conditions as in Example 1, except that a release layer having a film thickness of 2.5 μm was formed using the release layer-forming composition B. Further, the laminates of Examples 7 to 9 were fabricated under the same conditions as in Example 6, except that the film thickness of the release layer was changed.

In Examples 6 to 9, the transmittance of infrared ray having a wavelength of 9.3 μm to the release layer of each laminate was evaluated. The transmittance was measured by a FT-IR apparatus (manufactured by THERMO Inc.).

The separability of the laminates of Examples 6 to 9 and the transmittance of infrared ray in the release layer are shown in Table 3. In the evaluation of damage shown in Table 3, in order to confirm the damage to a substrate by irradiation with laser, the evaluation thereof was performed by observing the presence or absence of laser dent using a microscope. In the evaluation of damage, a case where damage was hardly seen is represented by "B", and a case where damage was not seen at all is represented by "A".

TABLE 3

| | Adhesive | Release layer-forming composition | Release layer forming portion | Film thickness (μm) | Evaluation of damage | Transmittance (%) |
|---|---|---|---|---|---|---|
| | | | Release layer | | | |
| Example 6 | a | B | Only entire periphery | 2.5 | B | 12 |
| Example 7 | a | B | Only entire periphery | 5.2 | A | 5 |
| Example 8 | a | B | Only entire periphery | 8.4 | A | 0 |
| Example 9 | a | B | Only entire periphery | 9.0 | A | 0 |

As shown in Table 3, it was found that, in the laminates of Examples 6 to 9, the transmittance of infrared ray decreases as the film thickness of the release layer increases. From the results of transmittance of the laminates of Examples 6 to 9, it is clearly understood that, as the film thickness of the release layer increases, infrared ray applied through the silicon support plate in the laminate does not reach a semiconductor wafer substrate without passing through the first adhesive layer, thereby preventing the semiconductor wafer substrate from being damaged.

Separability Evaluation 3 of Support (Second Embodiment)

As Example 10 and Reference Example 2, laminates each having a second adhesive layer were fabricated, and the separability of a support in each of the laminates was evaluated.

As Example 10, a semiconductor wafer substrate, and a silicon support plate provided with a release layer on only the periphery of surface thereof (only within a range of width of 5 mm from the periphery of the silicon support plate of 12 inches toward the inside thereof) facing the semiconductor wafer substrate were laminated through a first adhesive layer containing a release agent and a second adhesive layer not containing the release agent, so as to fabricate a laminate.

In Example 10, a release layer was formed on only the entire periphery of a silicon support plate under the same conditions as those in Example 1, and then a first adhesive layer having a film thickness of 25 μm was formed on the entire surface of the silicon support plate, the surface being provided with the release layer, using the same adhesive a as that in Example 1. In addition, a second adhesive layer having a film thickness of 25 μm was formed on the entire surface of one side of a semiconductor wafer substrate using the adhesive b. Thereafter, the silicon support plate and the semiconductor wafer substrate were laminated through the first adhesive layer and the second adhesive layer such that the release layer of the silicon support plate faces the semiconductor wafer substrate, thereby fabricating the laminate of Example 10.

The laminate of Reference Example 2 was fabricated under the same conditions as in the fabrication of the laminate of Example 10 except that a release layer was not formed.

The separability of a support was evaluated under the same conditions as in the "separability evaluation 1". The configurations and separability evaluation results of the laminates of Example 10 and Reference Example 2 are shown in Table 4.

TABLE 4

| | First adhesive layer | Second adhesive layer | Release layer | | Separability |
| | | | Release layer-forming composition | Release layer forming portion | |
|---|---|---|---|---|---|
| Example 10 | Adhesive a | Adhesive b | A | Only entire periphery | A |
| Reference Example 2 | Adhesive a | Adhesive b | — | — | A |

As shown in Table 4, the separability of any one of the semiconductor wafer substrate and the silicon support plate in each of the laminates of Example 10 and Reference Example 2 was "A". Even in the case of any of the laminates of Example 10 and Reference Example 2, the semiconductor wafer substrate and the silicon support plate were separated in a state where the second adhesive layer adhered closely to the side of the semiconductor wafer substrate to allow this second adhesive layer and the first adhesive layer to be bonded to the side of the semiconductor wafer substrate.

In the above-described laminate of Example 10, the semiconductor wafer substrate and the silicon support plate are separated in a state where the first adhesive layer is bonded to the side of the semiconductor wafer substrate, and a part of the periphery of the first adhesive layer is also separated from the semiconductor wafer substrate. It is determined that, in the separation process, the peeling of a part of the first adhesive layer in the side of the semiconductor wafer substrate occurs when the periphery of the first adhesive layer is stretched by the residues of the non-altered release layer in the side of the silicon support plate. In the laminate of Reference Example 1, the semiconductor wafer substrate and the silicon support plate are separated in a state where the adhesive layer is bonded to the side of the silicon support plate.

From the results of Example 10 and Reference Example 2, it was found that the second adhesive layer not containing a release agent is formed on the side of the semiconductor wafer substrate, and thus, in the separation process, it is possible to separate an element formed on the substrate 1 without being damaged at the time of separating the semiconductor wafer substrate and the silicon support plate.

INDUSTRIAL APPLICABILITY

The present invention can be appropriately used in the process of preparing a miniaturized semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of preparing a laminate, in which the laminate has a substrate and a support supporting the substrate, a release layer capable of being altered by irradiation with infrared ray is provided on one surface of the surface of the substrate and the surface of the support which face each other, and the substrate and the support are laminated through a first adhesive layer containing a release agent, the method comprising:
   forming the release layer on only a periphery of one of the substrate and the support; and
   laminating the substrate and the support through the release layer and the first adhesive layer,
   wherein the release layer contains a reactive polysilsesquioxane, the first adhesive layer contains a thermoplastic resin, and the release agent contains a silicone oil.

2. The method of preparing a laminate according to claim 1, comprising applying a release layer-forming composition for forming a release layer onto only the periphery of one of the substrate and the support in order to form the release layer on only a periphery of one of the substrate and the support.

3. The method of preparing a laminate according to claim 1, comprising forming the release layer on only the periphery of the support.

4. The method of preparing a laminate according to claim 1, wherein, in the forming of the release layer, the release layer is formed on the periphery of one of the substrate and the support, the periphery having a width in a range of 0.5 mm to 10 mm in a direction from an end thereof toward an inside thereof.

5. The method of preparing a laminate according to claim 1, comprising, before laminating the substrate and the support, forming a second adhesive layer not containing a release agent on the substrate.

6. The method of preparing a laminate according to claim 1, wherein the support is made of silicon.

7. A method of separating a support, comprising:
   preparing a laminate by the method of preparing a laminate according to claim 1;
   irradiating the release layer with infrared ray to alter the release layer, so as to reduce the adhesive force of the release layer;
   fixing one of the substrate and the support; and
   applying a force to the other of the substrate and the support, so as to separate the support from the substrate.

8. A method of separating a support, comprising:
   preparing a laminate by the method of preparing a laminate according to claim 6;
   irradiating the release layer with infrared ray through the support to alter the release layer, so as to reduce the adhesive force of the release layer;
   fixing one of the substrate and the support; and applying a force to the other thereof, so as to separate the support from the substrate.

9. The method of separating a support according to claim 7, comprising irradiating the release layer with a $CO_2$ laser to alter the release layer.

10. The method of separating a support according to claim 8, comprising irradiating the release layer with a $CO_2$ laser to alter the release layer.

11. The method of separating a support according to claim 7, which is a support separating method of separating a laminate in which an end of the periphery of the support is chamfered, comprising gripping the chamfered portion of the end of the periphery of the support by a gripping member and then applying a force thereto, so as to separate the support from the substrate.

12. The method of separating a support according to claim 8, which is a support separating method of separating a laminate in which an end of the periphery of the support is chamfered, comprising gripping the chamfered portion of the end of the periphery of the support by a gripping member and then applying a force thereto, so as to separate the support from the substrate.

13. The method of separating a support according to claim 9, which is a support separating method of separating a laminate in which an end of the periphery of the support is chamfered, comprising gripping the chamfered portion of the end of the periphery of the support by a gripping member and then applying a force thereto, so as to separate the support from the substrate.

14. The method of separating a support according to claim 10, which is a support separating method of separating a laminate in which an end of the periphery of the support is chamfered, comprising gripping the chamfered portion of the end of the periphery of the support by a gripping member and then applying a force thereto, so as to separate the support from the substrate.

15. The method of preparing a laminate according to claim 1, wherein:
the first adhesive layer contains an elastomer as a thermoplastic resin; and
the release agent contains a carbinol-modified silicone oil.

16. The method of preparing a laminate according to claim 1, wherein the release layer is formed by:
(a) applying, onto only the periphery of the one of the substrate and the support, a composition containing:
(i) reactive polysilsesquioxane having a structure represented by Formula (1) below

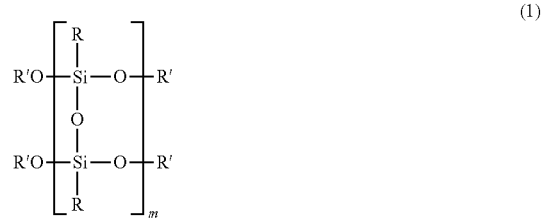

wherein each R is an independently selected organic group, each R' is independently selected from the group consisting of a hydrogen atom and an alkyl group having 1 to 10 carbon atoms, and m is an integer of 1 to 100, and
(ii) a crosslinkable group-containing siloxane which contains one or more crosslinkable groups selected from the group consisting of an epoxy group, an alkoxy group, a carboxyl group, a carbonyl group, and a hydroxyl group; and
(b) polymerizing the reactive polysilsesquioxane and the crosslinkable group-containing siloxane by heating the composition.

* * * * *